(12) United States Patent
Kim et al.

(10) Patent No.: US 10,686,018 B2
(45) Date of Patent: Jun. 16, 2020

(54) DISPLAY DEVICE AND MANUFACTURING METHOD THEREOF

(71) Applicant: Samsung Display Co., Ltd., Yongin-si, Gyeonggi-do (KR)

(72) Inventors: Hyunwoong Kim, Yongin-si (KR);
Seungkyu Lee, Yongin-si (KR);
Wonkyu Kwak, Yongin-si (KR);
Jongwon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/562,987

(22) Filed: Sep. 6, 2019

(65) Prior Publication Data

US 2019/0393275 A1    Dec. 26, 2019

Related U.S. Application Data

(63) Continuation of application No. 15/944,636, filed on Apr. 3, 2018, now Pat. No. 10,453,901.

(30) Foreign Application Priority Data

Sep. 5, 2017    (KR) .................. 10-2017-0113353

(51) Int. Cl.
*H01L 27/32* (2006.01)
*H01L 51/52* (2006.01)

(52) U.S. Cl.
CPC ........ *H01L 27/3216* (2013.01); *H01L 27/326* (2013.01); *H01L 27/3213* (2013.01); *H01L 27/3218* (2013.01); *H01L 27/3246* (2013.01); *H01L 27/3262* (2013.01);

(Continued)

(58) Field of Classification Search
CPC ............ H01L 27/3216; H01L 27/3218; H01L 27/3246; H01L 27/326; H01L 27/3276
See application file for complete search history.

(56) References Cited

U.S. PATENT DOCUMENTS

| 2015/0162391 A1 | 6/2015 | Kim |
| 2016/0218159 A1 | 7/2016 | Park et al. |
| 2016/0240592 A1 | 8/2016 | Li et al. |

(Continued)

FOREIGN PATENT DOCUMENTS

| KR | 10-2014-0035239 A | 3/2014 |
| KR | 10-1427593 B1 | 8/2014 |

(Continued)

OTHER PUBLICATIONS

EPO Extended Search Report dated Nov. 26, 2018, for corresponding European Patent Application No. 18186705.2 (9 pages).

*Primary Examiner* — Douglas M Menz
(74) *Attorney, Agent, or Firm* — Lewis Roca Rothgerber Christie LLP

(57) ABSTRACT

A display device and a method of manufacturing the display device are provided. A display device includes: a plurality of first emission areas and a plurality of second emission areas alternately arranged at centers of virtual quadrangles aligned adjacent to each other in a row direction and a column direction; and a plurality of third areas respectively arranged at vertexes of the virtual quadrangles, and a difference between planar areas of the first to third emission areas is less than 25% of a largest planar area among the planar areas of the first to third emission areas.

20 Claims, 11 Drawing Sheets

(52) U.S. Cl.
CPC ........ *H01L 27/3276* (2013.01); *H01L 51/525* (2013.01); *H01L 27/3283* (2013.01)

(56) References Cited

U.S. PATENT DOCUMENTS

| | | |
|---|---|---|
| 2016/0359121 A1 | 12/2016 | Ito et al. |
| 2017/0039923 A1 | 2/2017 | Feng |
| 2017/0195658 A1 | 7/2017 | Jung |

FOREIGN PATENT DOCUMENTS

| | | |
|---|---|---|
| KR | 10-2015-0033968 A | 4/2015 |
| KR | 10-2015-0122580 A | 11/2015 |
| KR | 10-2016-0142940 A | 12/2016 |
| KR | 10-2017-0080348 A | 7/2017 |

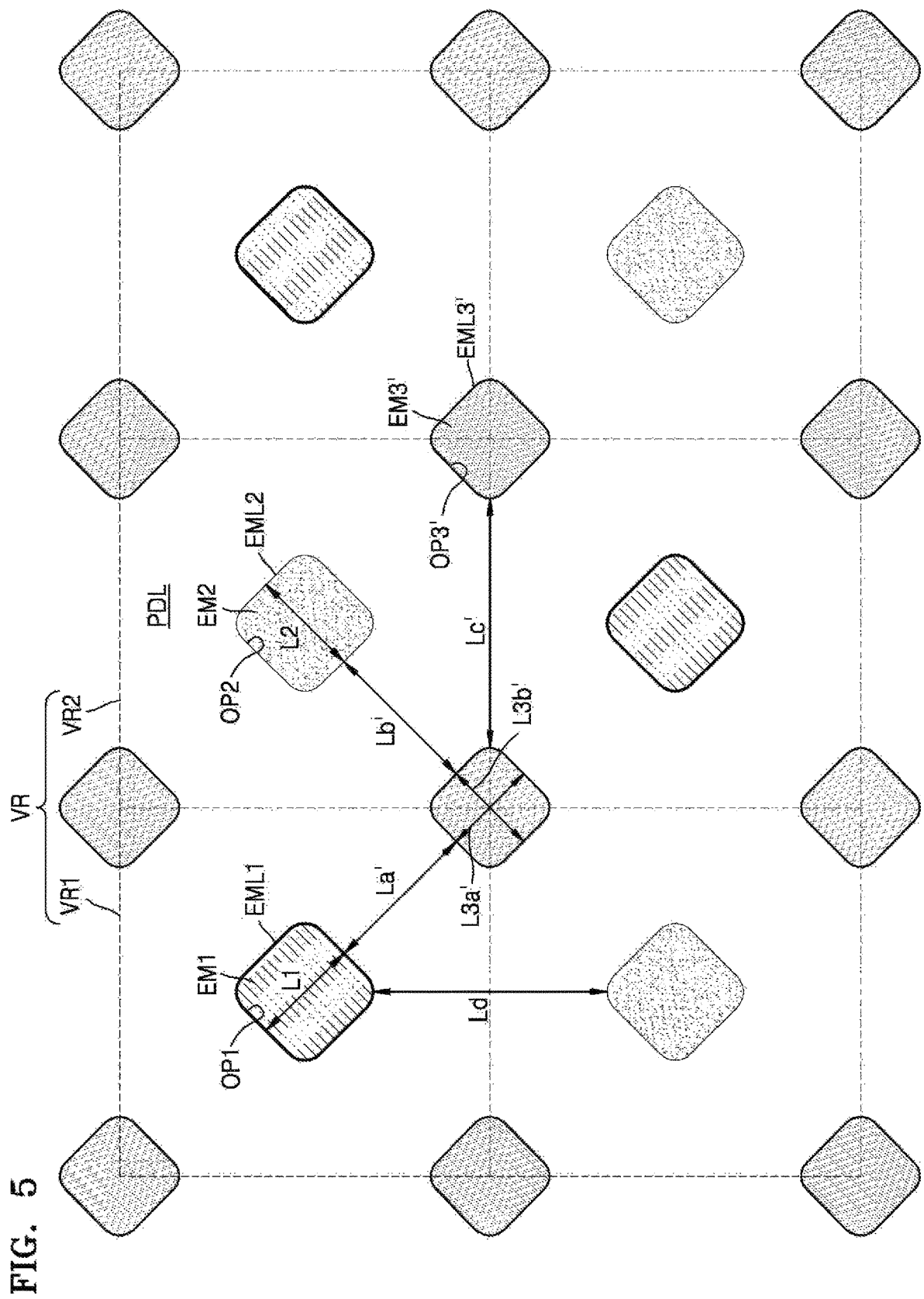

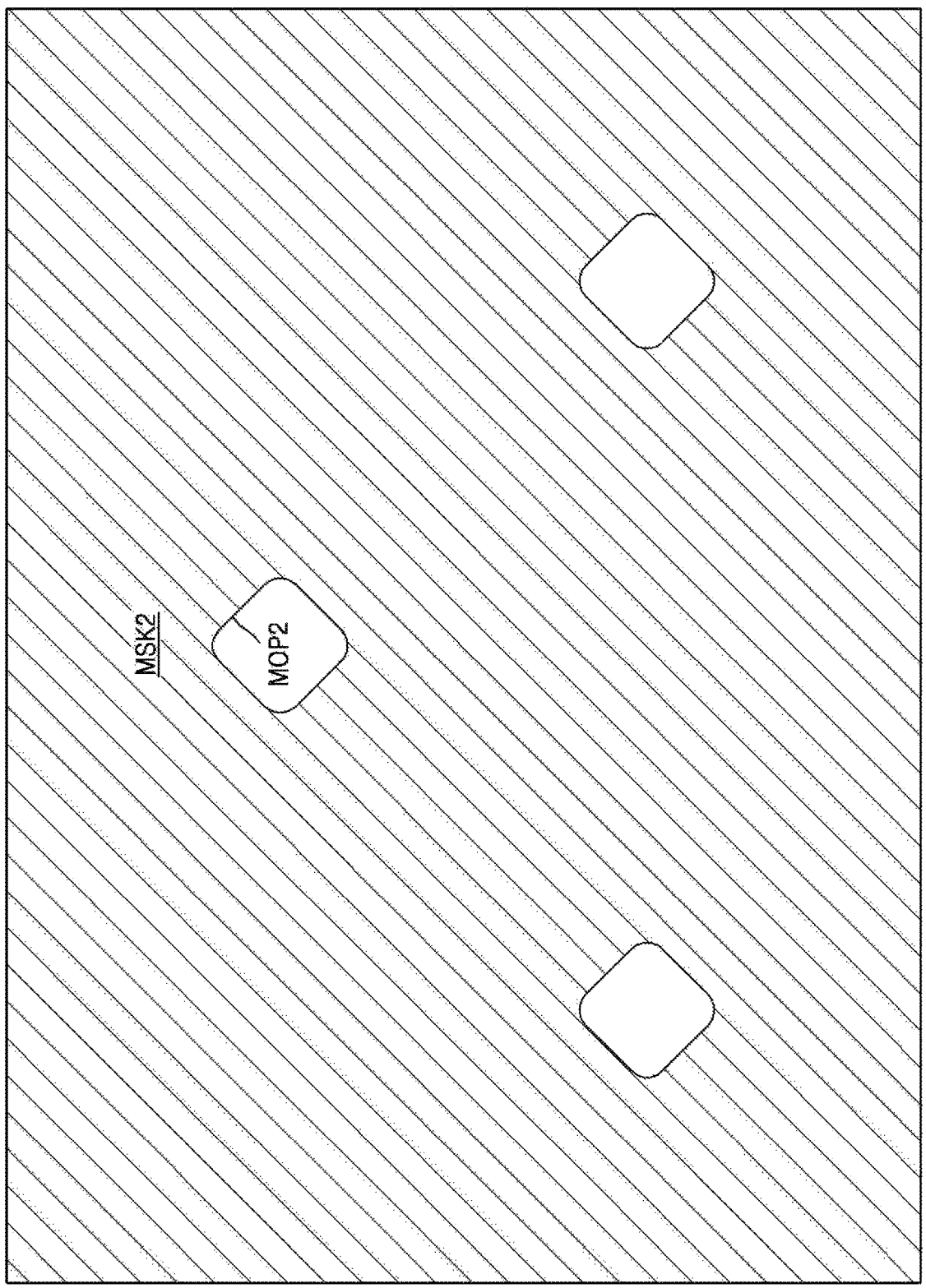

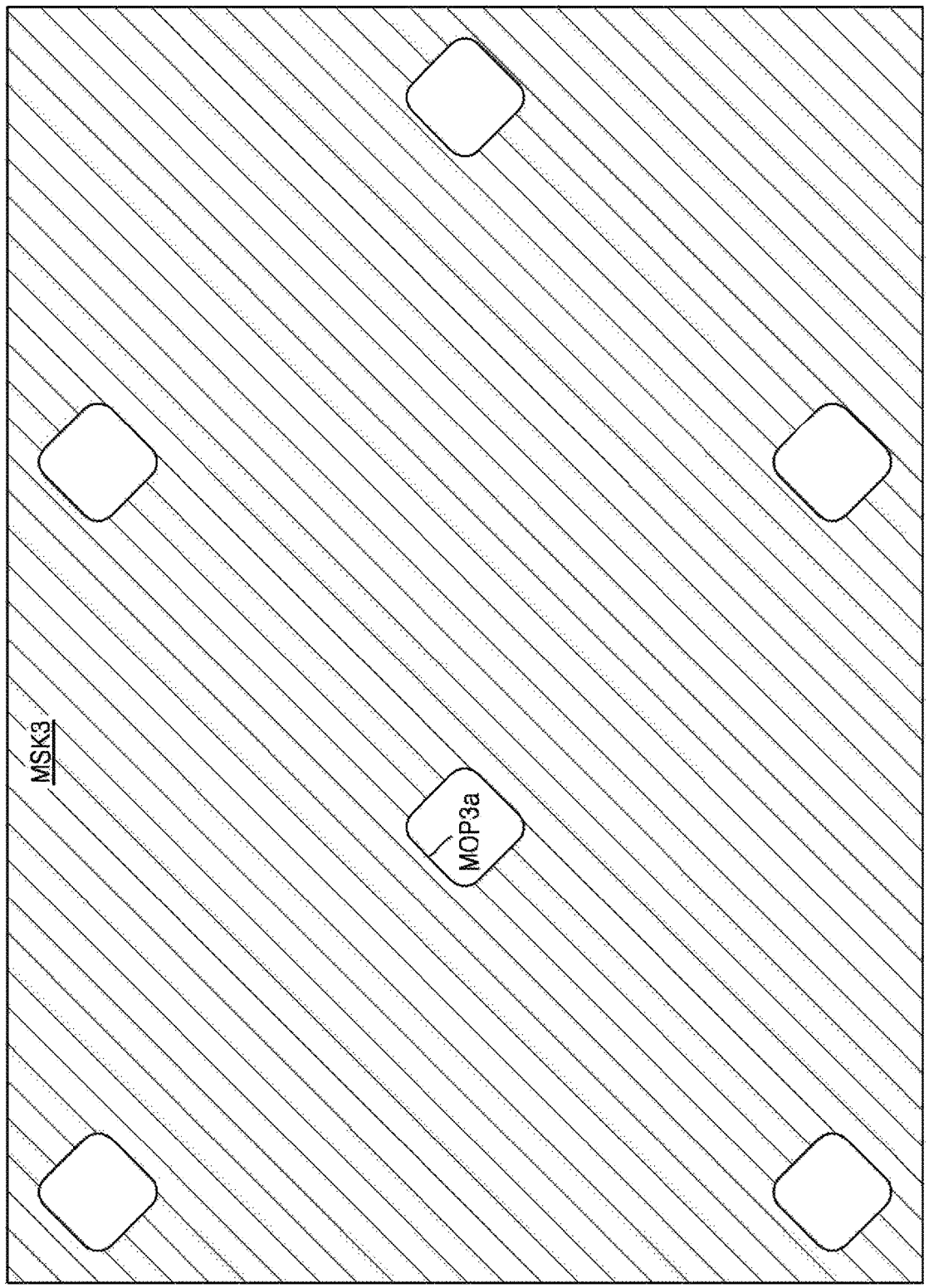

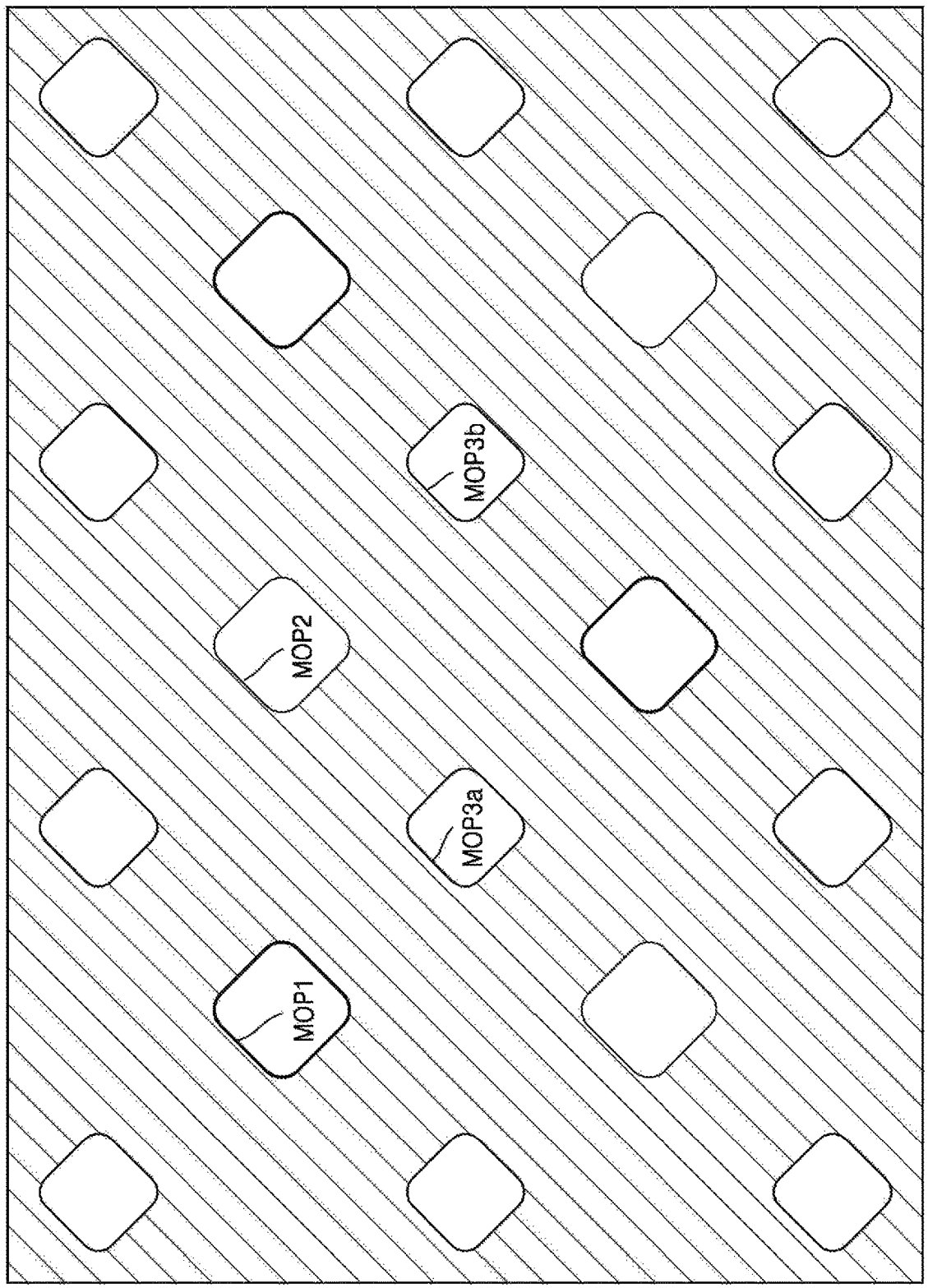

DISPLAY DEVICE AND MANUFACTURING METHOD THEREOF

CROSS-REFERENCE TO RELATED APPLICATIONS

This application is a continuation of U.S. Patent Application No. 15/944,636, filed on Apr. 3, 2018, which claims priority to and the benefit of Korean Patent Application No. 10-2017-0113353, filed on Sep. 5, 2017 in the Korean Intellectual Property Office, the entire disclosure of each of which is incorporated herein by reference.

BACKGROUND

1. Field

Aspects of one or more embodiments relate to a display device and a manufacturing method thereof.

2. Description of the Related Art

A display device is an apparatus for displaying an image, and, recently, organic light-emitting display devices have attracted attention. Unlike a liquid crystal display device, an organic light-emitting display device has self-emission characteristics and does not require a separate light source, and, thus, a thickness and a weight of an organic light-emitting display device may be reduced. Organic light-emitting display devices exhibit high-quality characteristics such as low power consumption, high brightness, and high response speeds.

Organic light-emitting display devices include sub-pixels respectively emitting light of different colors, and the sub-pixels display an image by emitting light. Here, a sub-pixel denotes a minimum unit emitting light in order to display an image. A gate line, a data line, a power line such as a driving power line for driving each sub-pixel, and an insulating layer, etc. such as a pixel-defining layer which defines a shape or area of each sub-pixel, may be arranged between adjacent sub-pixels.

An organic emission layer forming a sub-pixel is formed by depositing an organic emission material by using a mask such as a fine metal mask (FMM). In the case in which an interval between adjacent organic emission layers is designed to be short in order to secure an aperture ratio of a sub-pixel, deposition reliability is reduced. In the case in which an interval between adjacent organic emission layers is designed to be long in order to improve deposition reliability, an aperture ratio of a sub-pixel is reduced. An aperture ratio of a sub-pixel denotes a ratio of an area of an organic emission layer through which light is actually emitted to an entire area of a display area in which an image is displayed.

Meanwhile, as a demand for an apparatus displaying a high-quality image increases, resolution of a display device gradually increases. A display device has, for example, a Pentile sub-pixel arrangement structure in which two sub-pixels form one pixel, and an area and a driving current of an organic emission layer are gradually reduced. Due to a difference in an organic emission material of each sub-pixel, organic light-emitting diodes of each sub-pixel have different parasitic capacitances and driving current amounts. Due to differences in a parasitic capacitance and a driving current amount, a sub-pixel of a specific color may emit light of an intended amount at low brightness and later.

SUMMARY

According to an aspect of one or more embodiments, a display device has a high-resolution pixel arrangement structure. According to an aspect of one or more embodiments, the display device is an organic light-emitting display device, and the pixel arrangement structure is a sub-pixel arrangement structure.

Additional aspects will be set forth, in part, in the description which follows and, in part, will be apparent from the description, or may be learned by practice of the presented embodiments.

According to one or more embodiments, a display device includes: a plurality of first emission areas and a plurality of second emission areas alternately arranged at centers of virtual quadrangles aligned adjacent to each other in a row direction and a column direction; and a plurality of third emission areas respectively arranged at vertexes of the virtual quadrangles, wherein a difference between planar areas of the first to third emission areas is less than 25% of a largest planar area among the first to third emission areas.

A planar area of each of the third emission areas may be 75% or more of a larger area from among a planar area of each of the first emission areas and a planar area of each of the second emission areas.

The display device may further include: a substrate; a pixel electrode layer over the substrate and including a plurality of first pixel electrodes, a plurality of second pixel electrodes, and a plurality of third pixel electrodes; a pixel-defining layer over the pixel electrode layer and including a plurality of first openings each exposing a portion of the first pixel electrode, a plurality of second openings each exposing a portion of the second pixel electrode, and a plurality of third openings each exposing a portion of the third pixel electrode; a plurality of first emission layers each being on the first pixel electrode and including the first emission areas corresponding to the first openings; a plurality of second emission layers each being on the second pixel electrode and including the second emission areas corresponding to the second openings; a plurality of third emission layers each being on the third pixel electrode and including the third emission areas corresponding to the third openings; and an opposite electrode covering the first to third emission layers.

When the display device displays white at maximum brightness, a current amount supplied to the third emission layer may be 75% or more of a larger current amount among a current amount supplied to the first emission layers and a current amount supplied to the second emission layers.

A planar shape of each of the first emission areas and a planar shape of each of the second emission areas may be substantially rounded rectangular rhombuses.

A planar shape of each of the third emission areas may be a substantially rounded regular octagon, and a distance between the third emission areas and the first emission areas adjacent to each other may be different from a distance between the third emission areas and the second emission areas adjacent to each other by less than 5%.

A planar shape of each of the third emission areas may be a rounded regular octagon, and a distance between the third emission areas and the first emission areas adjacent to each other may be substantially the same as a distance between the third emission areas and the second emission areas adjacent to each other.

A length of each of the third emission areas in a first direction may be different from a length of each of the third emission areas in a second direction by less than 5%, the first direction being a direction extending from a center of one of the first emission areas to a center of one of the third emission areas, the second direction being a direction extending from a center of one of the second emission areas to a center of one of the third emission areas.

A planar shape of each of the third emission areas may be a substantially rounded rectangular rhombus, and a distance between the third emission areas and the first emission areas adjacent to each other may be different from a distance between the third emission areas and the second emission areas adjacent to each other by less than 5%.

A planar shape of each of the third emission areas may be a rounded quadrangle or a rounded rectangle, and a distance between the third emission areas and the first emission areas adjacent to each other may be substantially the same as a distance between the third emission areas and the second emission areas adjacent to each other.

A length of each of the third emission areas in a first direction may be different from a length of each of the third emission areas in a second direction by less than 5%, the first direction being a direction extending from a center of one of the first emission areas to a center of one of the third emission areas, the second direction being a direction extending from a center of one of the second emission areas to a center of one of the third emission areas.

A ratio of a length of each of the third emission areas in a first direction to a distance between the third emission areas and the first emission areas adjacent to each other may be different from a ratio of a length of each of the third emission areas in a second direction to a distance between the third emission areas and the second emission areas adjacent to each other by less than 5%, the first direction being a direction extending from a center of one of the first emission areas to a center of one of the third emission areas, the second direction being a direction extending from a center of one of the second emission areas to a center of one of the third emission areas.

A planar shape of each of the first emission areas may be substantially the same as a planar shape of each of the second emission areas, and a planar shape of each of the third emission areas may be different from the planar shapes of the first emission areas and the second emission areas.

A length of each of the third emission areas in a first direction may be different from a length of each of the third emission areas in a second direction by less than 10%, the first direction being a direction extending from a center of one of the first emission areas to a center of one of the third emission areas, the second direction being a direction extending from a center of one of the second emission areas to a center of one of the third emission areas.

From among the plurality of third emission areas, four third emission areas may be arranged adjacent to and vertically and horizontally symmetric with respect to a center of each of the virtual quadrangles.

Five hundred or more third emission areas may be arranged within one inch in a diagonal direction of the virtual quadrangle.

The first emission areas may emit red light, the second emission areas may emit green light, and the third emission areas may emit blue light.

Each of the virtual quadrangles may be substantially a rectangle or a square.

According to one or more embodiments, a display device includes: a substrate comprising first virtual quadrangles and second virtual quadrangles alternately arranged adjacent to each other in a row direction and a column direction and having a same shape; a pixel electrode layer over the substrate and comprising a plurality of first pixel electrodes, a plurality of second pixel electrodes, and a plurality of third pixel electrodes; a pixel-defining layer over the pixel electrode layer and comprising a plurality of first openings each exposing a portion of one of the first pixel electrodes and arranged at a center of each of the first virtual quadrangles, a plurality of second openings each exposing a portion of one of the second pixel electrodes and arranged at a center of each of the second virtual quadrangles, and a plurality of third openings each exposing a portion of one of the third pixel electrodes and respectively arranged at vertexes of the first and second virtual quadrangles; a plurality of first emission layers each being arranged on one of the first pixel electrodes such that at least a portion of each of the first emission layers fills one of the first openings; a plurality of second emission layers each being arranged on one of the second pixel electrodes such that at least a portion of each of the second emission layers fills one of the second openings; a plurality of third emission layers each being arranged on one of the third pixel electrodes such that at least a portion of each of the third emission layers fills one of the third openings; and an opposite electrode covering the plurality of first to third emission layers, wherein a difference between planar areas of the first to third openings is less than 25% of a largest planar area among the planar areas of the first to third openings.

Each of the plurality of first emission layers may include a first emission area corresponding to one of the first openings, each of the plurality of second emission layers may include a second emission area corresponding to one of the second openings, and each of the plurality of third emission layers may include a third emission area corresponding to one of the third openings.

According to one or more embodiments, a method of manufacturing a display device includes: preparing a substrate comprising first virtual quadrangles and second virtual quadrangles alternately arranged adjacent to each other in a row direction and a column direction; forming a pixel electrode layer over the substrate, the pixel electrode layer comprising a plurality of first pixel electrodes, a plurality of second pixel electrodes, and a plurality of third pixel electrodes; forming a pixel-defining layer over the pixel electrode layer, the pixel-defining layer comprising a plurality of first openings each exposing a portion of one of the first pixel electrodes and arranged at a center of one of the first virtual quadrangles, a plurality of second openings each exposing a portion of one of the second pixel electrodes and arranged at a center of one of the second virtual quadrangles, and a plurality of third openings each exposing a portion of one of the third pixel electrodes and respectively arranged at vertexes of the first and second virtual quadrangles; forming, by using a first mask, a plurality of first emission layers selectively filling the plurality of first openings among the plurality of first to third openings; forming, by using a second mask, a plurality of second emission layers selectively filling the plurality of second openings among the plurality of first to third openings; forming, by using a third mask, a portion of a plurality of third emission layers selectively filling a portion of the plurality of third openings among the plurality of first to third openings; and forming, by using a fourth mask, the rest of the plurality of third emission layers selectively filling the rest of the plurality of third openings among the plurality of first to third openings, wherein a difference between planar areas of the first to third openings is less than 25% of a largest planar area among planar areas of the first to third openings.

A planar shape of each of the first openings and a planar shape of each of the second openings may be substantially rounded rectangular rhombuses.

A planar shape of each of the third openings may be a substantially rounded rectangular rhombus, and a distance between the third openings and the first openings adjacent to each other may be different from a distance between the third openings and the second openings adjacent to each other by less than 5%.

A planar shape of each of the third openings may be a substantially rounded rectangle in which a distance between two sides facing each other is different from a distance between the other two sides facing each other by less than 5%, and a distance between the third openings and the first openings adjacent to each other may be substantially the same as a distance between the third openings and the second openings adjacent to each other.

A planar area of each of the third openings may be less than a planar area of each of the second openings and may be 75% or more of the planar area of each of the second openings, and a planar area of each of the first openings may be less than the planar area of each of the second openings and may be 90% or more of the planar area of each of the second openings.

BRIEF DESCRIPTION OF THE DRAWINGS

These and/or other aspects will become apparent and more readily appreciated from the following description of some embodiments, taken in conjunction with the accompanying drawings in which:

FIG. 5 is a plan view of a portion of a plane of an organic light-emitting display device according to another embodiment;

FIGS. 6A to 6D are plan views of a portion of first to fourth masks, respectively, for manufacturing the organic light-emitting display device of FIG. 5;

FIG. 7 is a reference view of the first to fourth masks illustrated in FIGS. 6A to 6D when superimposed.

DETAILED DESCRIPTION

Figure 1:
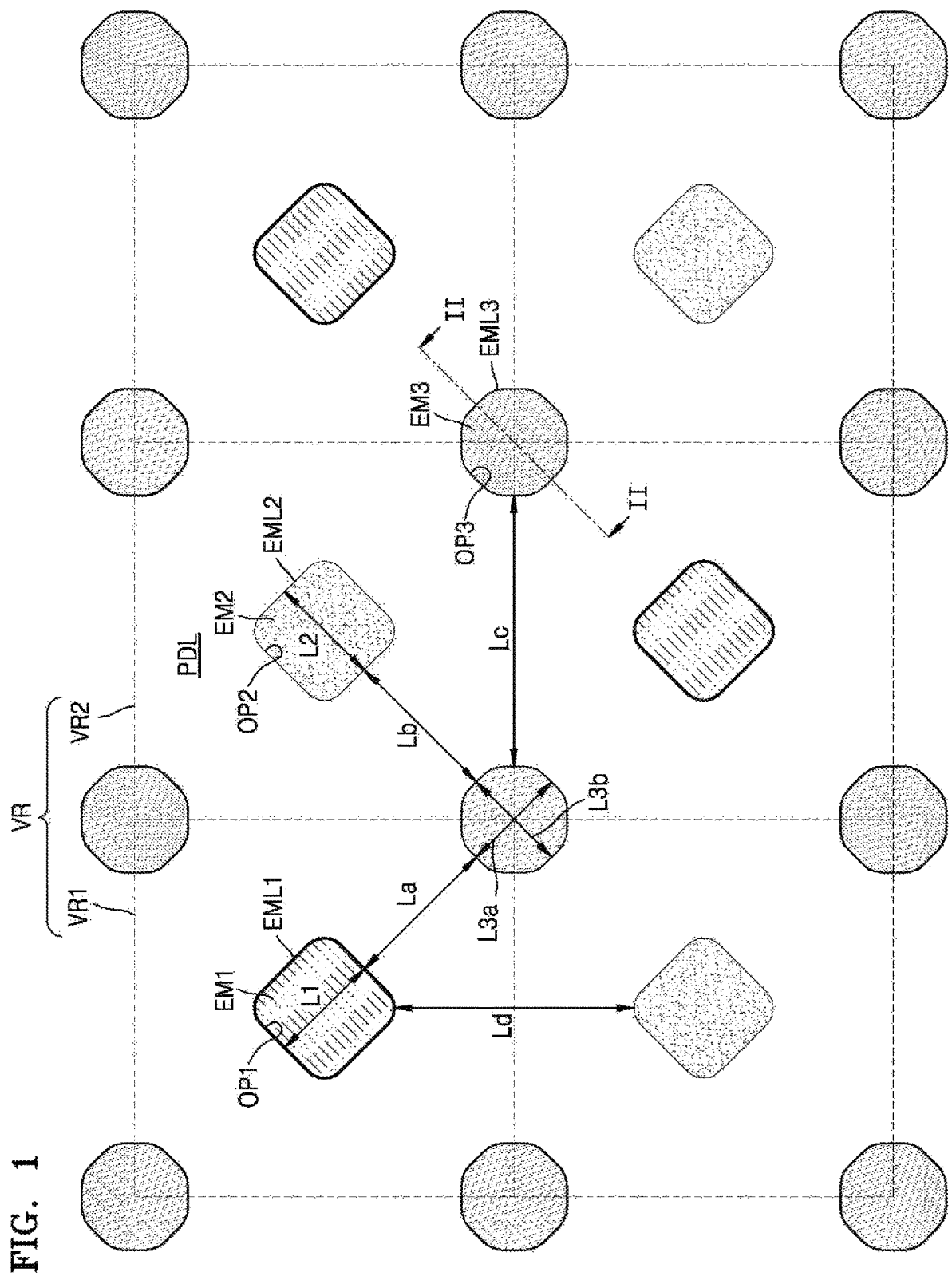
FIG. 1 is a plan view of a portion of a plane of an organic light-emitting display device according to an embodiment.

As the disclosure allows for various changes and numerous embodiments, some example embodiments will be illustrated in the drawings and described in further detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Herein, the disclosure will be described more fully with reference to the accompanying drawings. For clear description of the present disclosure, portions unrelated to the description may be omitted. When description is made with reference to the drawings, like reference numerals in the drawings denote like or corresponding elements, and repeated description thereof may be omitted.

It is to be understood that when a layer, region, or component is referred to as being "formed on," another layer, region, or component, it may be directly or indirectly formed on the other layer, region, or component. That is, for example, one or more intervening layers, regions, or components may be present. Sizes of elements in the drawings may be exaggerated for convenience of explanation. In other words, since sizes and thicknesses of components in the drawings may be arbitrarily illustrated for convenience of explanation, the following embodiments are not limited thereto.

It is to be understood that when a layer, region, or component is referred to as being "connected" to another layer, region, or component, it may be directly connected to the other layer, region, or component or may be indirectly connected to the other layer, region, or component with one or more other layers, regions, or components interposed therebetween. For example, it is to be understood that when a layer, region, or component is referred to as being "electrically connected" to another layer, region, or component, it may be directly electrically connected to the other layer, region, or component or may be indirectly electrically connected to other layer, region, or component with one or more other layers, regions, or components interposed therebetween.

It is to be understood that although the terms "first," "second," etc. may be used herein to describe various components, these components should not be limited by these terms. These terms are used to distinguish one component from another. Throughout the specification, the singular forms "a," "an," and "the" are intended to include the plural forms as well, unless the context clearly indicates otherwise. When a certain element "comprises" an element, the element does not exclude other elements and may further comprise one or more other elements unless the context indicates otherwise.

In the accompanying drawings, modifications of illustrated shapes may be expected depending on, for example, manufacturing technologies and/or tolerances.

Therefore, embodiments of the present disclosure should not be construed as being limited to a specific shape of an area illustrated in the present specification, and should include, for example, changes of a shape caused during a manufacturing process.

Herein, a sub-pixel arrangement structure of an organic light-emitting display device according to an embodiment is described with reference to FIGS. 1 and 2.

FIG. 1 is a plan view of a portion of a plane of an organic light-emitting display device according to an embodiment. For convenience of description, FIG. 1 mainly illustrates an emission area of a sub-pixel and a pixel-defining layer defining a shape, a size, etc. of the emission area. FIG. 2 illustrates a cross-sectional view of the organic light-emitting display device of FIG. 1, taken along the line II-II of FIG. 1.

Figure 2:
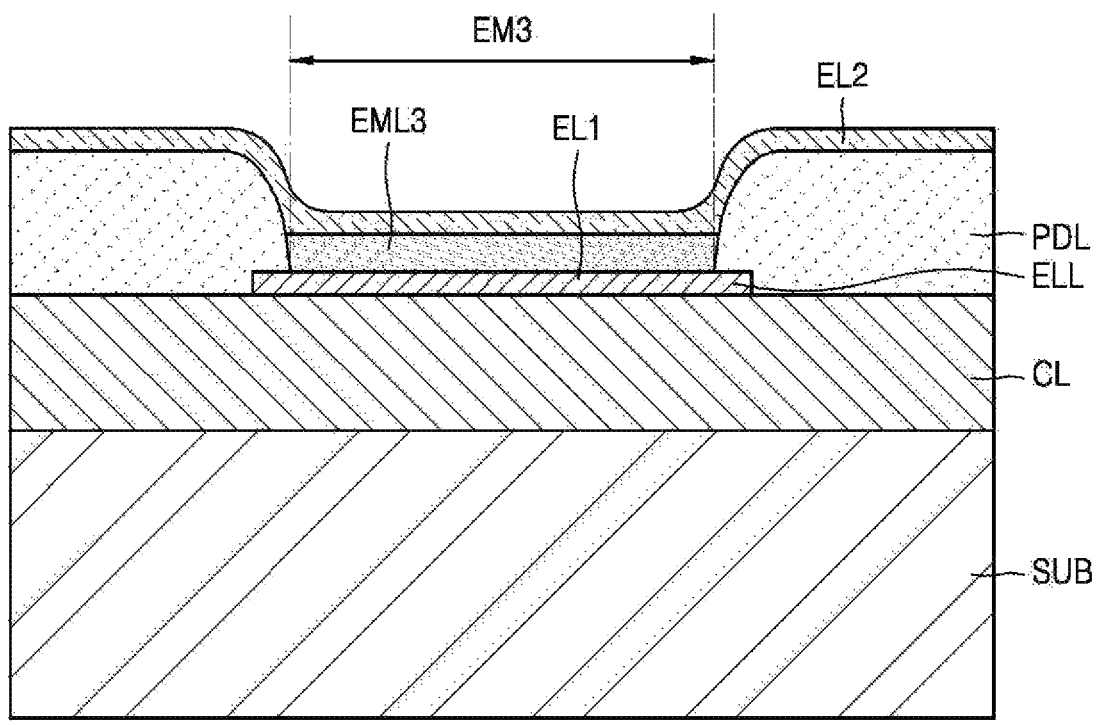
FIG. 2 is a cross-sectional view of the organic light-emitting display device of FIG. 1, taken along the line II-II.

As illustrated in FIGS. 1 and 2, an organic light-emitting display device according to an embodiment includes a substrate SUB, a circuit layer CL, a pixel-electrode layer ELL including a pixel electrode EL1, first to third emission areas EM1, EM2, and EM3, an opposite electrode EL2, and a pixel-defining layer PDL.

The substrate SUB may be an insulating substrate including any of glass, quartz, ceramic, metal, and plastic, for example. In the case in which the substrate SUB includes plastic, etc., the organic light-emitting display device may have a flexible, stretchable, or rollable characteristic.

The circuit layer CL is arranged on the substrate SUB and may include wirings including a scan line, a data line, a driving power line, etc., and pixel circuits such as a thin film transistor (TFT) and a capacitor, etc. connected to the wirings. One sub-pixel may include a pixel circuit including two or more TFTs and a capacitor and connected to a scan line, a data line, and a driving power line. Two or more TFTs included in one sub-pixel may include, for example, a switching TFT transferring a data voltage transferred through a data line to a capacitor in response to a scan signal applied through a scan line, and a driving TFT generating a driving current between a driving power line and an emission element depending on a voltage stored in the capacitor. The circuit layer CL may have any of various known structures, and the pixel circuit may have any of various circuit arrangements.

The pixel electrode layer ELL including the pixel electrode EL1 is arranged on the circuit layer CL, and the pixel electrode EL1 is connected to a TFT inside the circuit layer CL. A third emission layer EML3 is arranged on the pixel electrode EL1 illustrated in FIG. 2. The pixel electrode EL1 on which the third emission layer EML3 is arranged may be referred to as a third pixel electrode. In this manner, a pixel electrode EL1 on which a first emission layer EML1 is arranged may be referred to as a first pixel electrode, and a pixel electrode EL1 on which a second emission layer EML2 is arranged may be referred to as a second pixel electrode. The pixel electrode layer ELL includes the first to third pixel electrodes. A planar shape of the pixel electrode EL1 may be variously designed depending on an arrangement of the pixel circuit inside the circuit layer CL and an arrangement of the first to third emission areas EM1, EM2, and EM3 on the pixel electrode EL1.

The pixel-defining layer PDL is arranged on the pixel electrode layer ELL and the circuit layer CL and includes openings OP1, OP2, and OP3 exposing a portion of the pixel electrode EL1. A first opening OP1 may expose a portion of the first pixel electrode, a second opening OP2 may expose a portion of the second pixel electrode, and a third opening OP3 may expose a portion of the third pixel electrode.

The first to third emission layers EML1, EML2, and EML3 are respectively arranged on the respective portions of the first to third pixel electrodes exposed through the openings OP1, OP2, and OP3 of the pixel-defining layer PDL.

The first emission layer EML1 may be arranged on a portion of the first pixel electrode exposed through the first opening OP1 and fill the first opening OP1. The first emission layer EML1, which fills the first opening OP1, may contact a portion of the first pixel electrode, and emit light of a first color when a current flows therethrough. In this case, light of the first color may be emitted from an entire area of the first emission layer EML1, and the first emission layer EML1 may substantially coincide with the first emission area EM1. Therefore, the first emission area EM1 may correspond to the first opening OP1.

The second emission layer EML2 may be arranged on a portion of the second pixel electrode exposed through the second opening OP2 and fill the second opening OP2. The second emission layer EML2, which fills the second opening OP2, may contact a portion of the second pixel electrode, and emit light of a second color when a current flows therethrough. In this case, light of the second color may be emitted from an entire area of the second emission layer EML2, and the second emission layer EML2 may substantially coincide with the second emission area EM2. Therefore, the second emission area EM2 may correspond to the second opening OP2.

The third emission layer EML3 may be arranged on a portion of the third pixel electrode exposed through the third opening OP3 and fill the third opening OP3. The third emission layer EML3, which fills the third opening OP3, may contact a portion of the third pixel electrode, and emit light of a third color when a current flows therethrough. In this case, light of the third color may be emitted from an entire area of the third emission layer EML3, and the third emission layer EML3 may substantially coincide with the third emission area EM3. Therefore, the third emission area EM3 may correspond to the third opening OP3.

The first to third emission areas EM1, EM2, and EM3 may not respectively exactly correspond to the first to third openings OP1, OP2, and OP3 depending on cross-sectional profiles of the first to third openings OP1, OP2, and OP3, and emission materials of the first to third emission layers EML1, EML2, and EML3. For example, the first to third emission areas EM1, EM2, and EM3 may be somewhat wider or narrower than the first to third openings OP1, OP2, and OP3.

The first opening OP1 of the pixel-defining layer PDL may define a planar shape, a size, and an area of the first emission area EM1 of the first emission layer EML1. The second opening OP2 of the pixel-defining layer PDL may define a planar shape, a size, and an area of the second emission area EM2 of the second emission layer EML2. The third opening OP3 of the pixel-defining layer PDL may define a planar shape, a size, and an area of the third emission area EM3 of the third emission layer EML3.

An edge portion of the pixel electrode EL1 may be covered by the pixel-defining layer PDL. The pixel electrode EL1 may be an anode electrode serving as a hole injection electrode, or a cathode electrode. The pixel electrode EL1 may include a light transmissive electrode or a light reflective electrode.

The opposite electrode EL2 is arranged on the first to third emission layers EML1, EML2, and EML3. In an embodiment, the opposite electrode EL2 may cover the first to third emission layers EML1, EML2, and EML3 over the entire surface of the substrate SUB. The opposite electrode EL2 may be a cathode electrode serving as an electron injection electrode, or an anode electrode. The opposite electrode EL2 may include a light transmissive electrode or a light reflective electrode.

Although not shown in FIG. 2, the pixel electrode EL1 may be connected to a TFT inside the circuit layer CL through a via plug passing through an insulating layer of the circuit layer CL. A boundary of the openings OP1, OP2, and OP3 of the pixel-defining layer PDL may be spaced apart from a via plug by a certain distance (e.g., a preset distance).

The pixel electrode EL1, one of the first to third emission layers EML1, EML2, and EML3, and the opposite electrode EL2 may configure one emission element. The emission element emits light at a brightness determined according to a driving current amount by using a driving current flowing through a TFT connected to the pixel electrode EL1. Since not only required current amounts differ but also emission efficiencies differ depending on material characteristics respective of the first to third emission layers EML1, EML2, and EML3, planar areas for emitting light of intended brightness may differ. For example, in a case in which an emission efficiency of the second emission layer EML2 is higher than an emission efficiency of the first emission layer EML1 or the third emission layer EML3, a driving current amount required by the second emission layer EML2 for emitting light of the second color may be less than driving current amounts of the first and third emission layers EML1 and EML3 while a planar area of the second emission area EM2 actually emitting light is less than planar areas of the first and third emission areas EM1 and EM3 actually emitting light.

FIG. 1 illustrates the first to third emission areas EM1, EM2, and EM3 and the pixel-defining layer PDL including the first to third openings OP1, OP2, and OP3 respectively corresponding to the first to third emission areas EM1, EM2, and EM3. Although FIG. 1 illustrates that the first to third emission areas EM1, EM2, and EM3 respectively correspond to the first to third openings OP1, OP2, and OP3, the first to third emission areas EM1, EM2, and EM3 may not respectively exactly coincide with the first to third openings OP1, OP2, and OP3.

Figure 3:
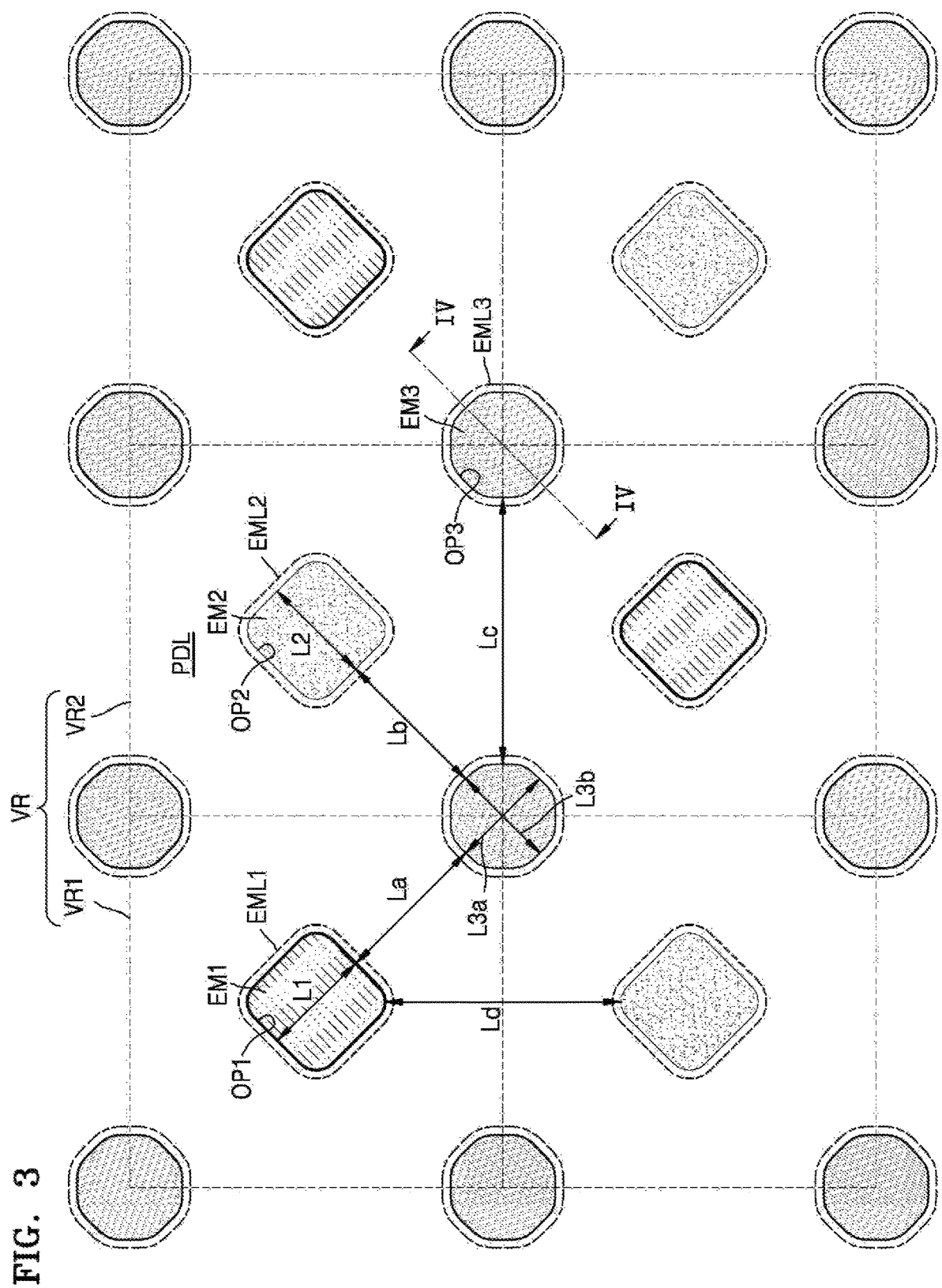
FIG. 3 is a plan view of a portion of a plane of an organic light-emitting display device according to another embodiment.
Figure 4:
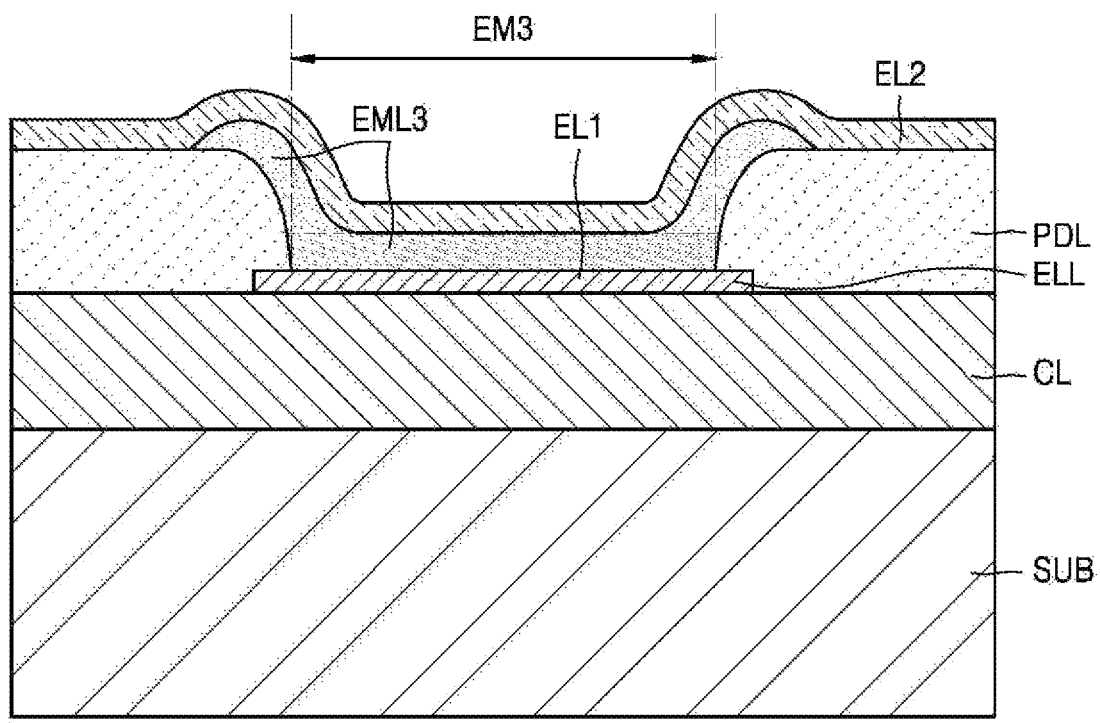
FIG. 4 is a cross-sectional view of the organic light-emitting display device of FIG. 3, taken along the line IV-IV.

According to another embodiment, as illustrated in FIG. 3, which is a plan view of a portion of a plane of an organic light-emitting display device according to another embodiment, and FIG. 4, which is a cross-sectional view of the organic light-emitting display device of FIG. 3 taken along the line IV-IV of FIG. 3, a portion of the first emission layer EML1 may fill the first opening OP1, and the rest of the first emission layer EML1 may be arranged on the pixel-defining layer PDL adjacent to the first opening OP1. Only the portion of the first emission layer EML1 filling the first opening OP1 may contact a portion of the first pixel electrode exposed by the first opening OP1, and emit light of the first color when a current flows therethrough. In this case, only the portion of the first emission layer EML1 may emit the light of the first color, and the portion of the first emission layer EML1 may correspond to the first emission area EM1. Therefore, the first emission area EM1 may correspond to the first opening OP1 or the portion of the first pixel electrode exposed by the first opening OP1.

A portion of the second emission layer EML2 may fill the second opening OP2, and the rest of the second emission layer EML2 may be arranged on the pixel-defining layer PDL adjacent to the second opening OP2. Only the portion of the second emission layer EML2 filling the second opening OP2 may contact a portion of the second pixel electrode exposed by the second opening OP2, and emit light of the second color when a current flows therethrough. In this case, only the portion of the second emission layer EML2 may emit the light of the second color, and the portion of the second emission layer EML2 may correspond to the second emission area EM2. Therefore, the second emission area EM2 may correspond to the second opening OP2 or the portion of the second pixel electrode exposed by the second opening OP2.

A portion of the third emission layer EML3 may fill the third opening OP3, and the rest of the third emission layer EML3 may be arranged on the pixel-defining layer PDL adjacent to the third opening OP3. Only the portion of the third emission layer EML3 filling the third opening OP3 may contact a portion of the third pixel electrode exposed by the third opening OP3, and emit light of the third color when a current flows therethrough. In this case, only the portion of the third emission layer EML3 may emit the light of the third color, and the portion of the third emission layer EML3 may correspond to the third emission area EM3. Therefore, the third emission area EM3 may correspond to the third opening OP3 or the portion of the third pixel electrode exposed by the third opening OP3.

However, the first to third emission areas EM1, EM2, and EM3 may not respectively exactly correspond to the first to third openings OP1, OP2, and OP3 depending on cross-sectional profiles of the first to third openings OP1, OP2, and OP3, and emission materials of the first to third emission layers EML1, EML2, and EML3. For example, the first to third emission areas EM1, EM2, and EM3 may be somewhat wider or narrower than the first to third openings OP1, OP2, and OP3.

Although FIG. 3 illustrates that planar shapes of the first to third emission layers EML1, EML2, and EML3 are substantially the same as planar shapes of the first to third emission areas EM1, EM2, and EM3 and are greater than the planar shapes of the first to third emission areas EM1, EM2, and EM3 by a certain size (e.g., a preset size), the planar shapes of the first to third emission layers EML1, EML2, and EML3 may not be the same as the planar shapes of the first to third emission areas EM1, EM2, and EM3.

As illustrated in FIG. 3, the first to third openings OP1, OP2, and OP3 of the pixel-defining layer PDL may respectively define planar shapes, sizes, and areas of the first to third emission areas EM1, EM2, and EM3 of the first to third emission layers EML1, EML2, and EML3. An edge portion of the pixel electrode EL1 may be covered by the pixel-defining layer PDL.

In a case in which an emission efficiency of the second emission layer EML2 is higher than an emission efficiency of the first emission layer EML1 or the third emission layer EML3, a driving current amount required by the second emission layer EML2 for emitting light of the second color may be less than driving current amounts of the first and third emission layers EML1 and EML3 while a planar area of the second emission area EM2 actually emitting light is less than planar areas of the first and third emission areas EM1 and EM3 actually emitting light.

Although FIG. 3 illustrates that the first to third emission areas EM1, EM2, and EM3 and the pixel-defining layer PDL including the first to third openings OP1, OP2, and OP3 respectively correspond to the first to third emission areas EM1, EM2, and EM3, the first to third emission areas EM1, EM2, and EM3 may not respectively exactly coincide with the first to third openings OP1, OP2, and OP3.

Referring to FIG. 1 again, virtual quadrangles VR aligned adjacent to each other in a row direction and a column direction are illustrated. Although FIG. 1 illustrates that the virtual quadrangles VR are squares, this is exemplary, and the virtual quadrangles VR may be rectangles substantially close to squares or parallelograms substantially close to squares. Although the following descriptions are made on the assumption that the virtual quadrangles VR are squares, the embodiments are not limited thereto.

A plurality of first emission areas EM1 and a plurality of second emission areas EM2 are arranged in turns, or alternately, at centers of the virtual quadrangles VR. A plurality of third emission areas EM3 are arranged at vertexes of the virtual quadrangles VR adjacent to each other in a row direction and a column direction. Differences between planar areas of the first to third emission areas EM1, EM2, and EM3 are less than 25% of a largest planar area among the first to third emission areas EM1, EM2, and EM3.

The number of first sub-pixels including the first emission layer EML1 and the number of second sub-pixels including the second emission layer EML2 may be substantially the same, and the number of third sub-pixels including the third emission layer EML3 may be twice the number of first sub-pixels or twice the number of second sub-pixels. However, due to arrangement of sub-pixels at an outermost portion of a display area in which an image is displayed, a shape, and a size of the display area, an emission layer of a specific color may be additionally arranged. In this case, the number of first sub-pixels and the number of second sub-pixels may not be exactly the same, or the number of third sub-pixels may not be exactly twice the number of first sub-pixels or the number of second sub-pixels. According to the present embodiment, pixels per inch of the organic light-emitting display device may be 500 or more. For example, the third sub-pixels including 500 or more third emission areas EM3 or third emission layers EML3 within 1 inch may be arranged in a diagonal direction of the virtual quadrangle VR.

The virtual quadrangles VR include first virtual quadrangles VR1 and second virtual quadrangles VR2 aligned in turns, or alternately, adjacent to each other in a row direction and a column direction. All of the first virtual quadrangles VR1 and the second virtual quadrangles VR2 may have the same shape, and may have a substantially square or rectangular shape. The first virtual quadrangle VR1 may be defined as a virtual quadrangle VR in which the first emission area EM1 is arranged at a center thereof, and the second virtual quadrangle VR2 may be defined as a virtual quadrangle VR in which the second emission area EM2 is arranged at a center thereof.

The first emission areas EM1 may be respectively arranged at centers of the first virtual quadrangles VR1. A center of the first emission area EM1 may substantially coincide with a center of the first virtual quadrangle VR1.

A planar shape of the first emission area EM1 may be a substantially rounded rectangular rhombus as illustrated in FIG. 1. In the present specification, a rectangular rhombus denotes a shape in which a square is rotated by about 45° and is symmetric with respect to a row direction and a column direction. A planar shape of the first emission area EM1 may be a rounded rhombus close to a rectangular rhombus, a chamfered rectangular rhombus, or a rectangular rhombus. In the present specification, a rounded rhombus close to a rectangular rhombus, a chamfered rectangular rhombus, or a rectangular rhombus is included in a substantially rounded rectangular rhombus.

The second emission areas EM2 may be respectively arranged at centers of the second virtual quadrangles VR2. A center of the second emission area EM2 may substantially coincide with a center of the second virtual quadrangle VR2. A planar shape of the second emission area EM2 may be a substantially rounded rectangular rhombus as illustrated in FIG. 1.

Although FIG. 1 illustrates that a planar area of the first emission area EM1 and a planar area of the second emission area EM2 are substantially the same, the embodiments are not limited thereto. According to an embodiment, a difference between a planar area of the first emission area EM1 and a planar area of the second emission area EM2 may be 10% or less. The planar area of the first emission area EM1 may be less than the planar area of the second emission area EM2. According to another embodiment, a difference between the planar area of the first emission area EM1 and the planar area of the second emission area EM2 may be 5% or less. According to another embodiment, a difference between the planar area of the first emission area EM1 and the planar area of the second emission area EM2 may be 3% or less.

According to an embodiment, a difference between a distance L1 between two sides of the first emission area EM1 facing each other, and a distance L2 between two sides of the second emission area EM2 facing each other may be about 5% or less. According to another embodiment, a difference between a distance L1 between two sides of the first emission area EM1 facing each other, and a distance L2 between two sides of the second emission area EM2 facing each other may be about 2.5% or less. According to another embodiment, a difference between a distance L1 between two sides of the first emission area EM1 facing each other, and a distance L2 between two sides of the second emission area EM2 facing each other may be about 1.5% or less.

The third emission areas EM3 may be respectively arranged at vertexes of the first and second virtual quadrangles VR1 and VR2 aligned adjacent to each other in a row direction and a column direction. Centers of the third emission areas EM3 may respectively substantially coincide with vertexes of the virtual quadrangles VR.

According to an embodiment, a planar shape of the third emission area EM3 may be a substantially rounded regular octagon as illustrated in FIG. 1. A planar shape of the third emission area EM3 may be a regular octagon or a chamfered regular octagon, and these shapes may be referred to as a substantially rounded regular octagon.

In the case in which a planar shape of the third emission area EM3 is a substantially rounded regular octagon, depending on a difference between a distance L1 between two sides of the first emission area EM1 facing each other, and a distance L2 between two sides of the second emission area EM2 facing each other, a difference between a distance La between the first emission area EM1 and the third emission area EM3 adjacent to each other, and a distance Lb between the second emission area EM2 and the third emission area EM3 adjacent to each other may be less than about 5%. According to another embodiment, a difference between the distance La and the distance Lb may be less than about 2%. According to another embodiment, a difference between the distance La and the distance Lb may be less than about 1%. The distance La may be defined as a shortest distance between an edge of the first emission area EM1 and an edge of the third emission area EM3, and the distance Lb may be defined as a shortest distance between an edge of the second emission area EM2 and an edge of the third emission area EM3. In an embodiment, for example, both the distance La and the distance Lb may be greater than 10 μm and less than 20 μm. For example, the distance La and the distance Lb may be respectively about 18.43 μm and about 18.35 μm, and the distance La may be longer than the distance Lb by about 1%.

According to another embodiment, the distance La and the distance Lb may be substantially the same. For example, both the distance La and the distance Lb may be greater than 10 μm and less than 20 μm. For example, both the distance La and the distance Lb may be about 18 μm. For example, both the distance La and the distance Lb may be about 18.35 μm. The distance La and the distance Lb may be the same as a critical dimension of a process of forming the first to third emission layers EML1, EML2, and EML3 respectively having the first to third emission areas EM1, EM2, and EM3. In this case, a planar shape of the third emission area EM3 may be a substantially rounded octagon, for example, an octagon, or a chamfered octagon.

Depending on a difference between a distance L1 between two sides of the first emission area EM1 facing each other, and a distance L2 between two sides of the second emission area EM2 facing each other, a difference between a length L3a of the third emission area EM3 in a first direction and a length L3b of the third emission area EM3 in a second direction may be about 5% or less. According to another embodiment, a difference between the length L3a and the length L3b may be less than about 3%. According to another embodiment, a difference between the length L3a and the length L3b may be less than about 2%. The first direction may be defined as a direction extending from a center of the first emission area EM1 to a center of the third emission area EM3. The second direction may be defined as a direction extending from a center of the second emission area EM2 to a center of the third emission area EM3. The first and second directions may change depending on relative positions of the third emission area EM3 with respect to the first and second emission areas EM1 and EM2. As a difference between the length L3a and the length L3b exists, a planar shape of the third emission area EM3 may be a shape in which a substantially rounded octagon is crushed or shortened in the first direction or the second direction.

According to various embodiments, since a difference between the distance L1 between two sides of the first emission area EM1 facing each other and the distance L2 between two sides of the second emission area EM2 facing each other is small, a difference between a ratio (L3a/La) of the length L3a of the third emission area EM3 in the first direction to the distance La between the third emission area EM3 and the first emission area EM1 adjacent to each other, and a ratio (L3b/Lb) of the length L3b of the third emission area EM3 in the second direction to the distance Lb between the third emission area EM3 and the second emission area EM2 adjacent to each other, may be about 5% or less. According to another embodiment, a difference between the ratio (L3a/La) and the ratio (L3b/Lb) may be about 3% or less. According to another embodiment, a difference between the ratio (L3a/La) and the ratio (L3b/Lb) may be about 2% or less. The first direction may be defined as a direction extending from a center of the first emission area EM1 to a center of the third emission area EM3, and the second direction may be defined as a direction extending from a center of the second emission area EM2 to a center of the third emission area EM3.

According to an embodiment, as a planar shape of the third emission areas EM3 is a substantially rounded octagon, a distance Lc between the third emission areas EM3 adjacent to each other may be longer than a critical dimension of a process of forming all of the third emission layers EML3 respectively including the third emission areas EM3 by using one mask, for example, a fine metal mask. For example, the distance Lc may be greater than 20 μm and less than 40 μm. For example, the distance Lc may be about 32.35 μm.

According to an embodiment, in a case in which planar shapes of all of the first and second emission areas EM1 and EM2 are substantially rounded rectangular rhombuses, and centers of the first and second emission areas EM1 and EM2 respectively coincide with centers of the first and second virtual quadrangles VR1 and VR2, a distance Ld between the first emission area EM1 and the second emission area EM2 may be constant in both a row direction and a column direction.

According to the present embodiment, since the distance La, the distance Lb, and the distance Lc may be secured between the first to third emission areas EM1, EM2, and EM3, not only the first to third emission layers EML1, EML2, and EML3 respectively including the first to third emission areas EM1, EM2, and EM3 may be formed by using a fine metal mask corresponding thereto, but also deposition reliability may be improved during a deposition process of using a fine metal mask. Therefore, according to the present embodiment, an organic light-emitting display device with improved deposition reliability is provided.

A planar area of the third emission area EM3 may be less than a planar area of the first emission area EM1 and a planar area of the second emission area EM2. According to an embodiment, the planar area of the third emission area EM3 may be 75% or more of a larger area among the planar area of the first emission area EM1 and the planar area of the second emission area EM2. According to another embodiment, the planar area of the third emission area EM3 may be 80% or more of a larger area among the planar area of the first emission area EM1 and the planar area of the second emission area EM2.

The planar area of the first emission area EM1 may be 90% or more of the planar area of the second emission area EM2. According to another embodiment, the planar area of the first emission area EM1 may be 95% or more of the planar area of the second emission area EM2. According to another embodiment, the planar area of the first emission area EM1 may be 97% or more of the planar area of the second emission area EM2.

For example, a ratio of the planar area of the first emission area EM1, the second emission area EM2, and the third emission area EM3 may be 0.975:1:0.771. For example, an aperture ratio of a first sub-pixel including the first emission area EM1 may be about 19.5%, an aperture ratio of a second sub-pixel including the second emission area EM2 may be about 20.0%, and an aperture ratio of a third sub-pixel including the third emission area EM3 may be about 15.42%.

As an organic light-emitting display device has a sub-pixel arrangement structure according to the present embodiment, when displaying white at maximum brightness, that is, displaying full white, a current amount supplied to the third emission layer EML3 may be 75% or more of a larger current amount among a current amount supplied to the first emission layer EML1 and a current amount supplied to the second emission layer EML2. According to another embodiment, when the organic light-emitting display device displays full white, a current amount supplied to the third emission layer EML3 may be 80% or more of a larger current amount among a current amount supplied to the first emission layer EML1 and a current amount supplied to the second emission layer EML2. For example, when the organic light-emitting display device displays full white, assuming that a current amount supplied to the third emission layer EML3 is 1, a current amount supplied to the first emission layer EML1 may be about 1.28, and a current amount supplied to the second emission layer EML2 may be about 1.05.

Unlike the present embodiment, in a case in which the first emission area EM1 and the third emission area EM3 are arranged at centers of virtual quadrangles VR, and the second emission areas EM2 are arranged at vertexes of the virtual quadrangles VR, and in which the number of the second emission areas EM2 is twice the number of the first emission areas EM1 and the third emission areas EM3, a planar area of the third emission area EM3 and a current amount supplied thereto become twice, and a planar area of the second emission area EM2 and a current amount supplied thereto become ½ times. In this case, a planar area of the third emission area EM3 becomes about three times a planar area of the second emission area EM2, and when full white is displayed, a current amount supplied to the third emission layer EML3 becomes about four times a current amount supplied to the second emission layer EML2. When deviation in planar areas of the first to third emission areas EM1, EM2, and EM3, and deviation in current amounts supplied to the first to third emission layers EML1, EML2, and EML3 increase, as the first to third emission areas EM1, EM2, and EM3 are arranged non-uniformly, due to an interval required between the first to third emission areas EM1, EM2, and EM3, there is a limitation in increasing resolution or pixels per inch of the organic light-emitting display device. Furthermore, as a current amount supplied to the second emission layer EML2 is reduced, a sub-pixel including the second emission layer EML2 emits light late compared with other sub-pixels including the first or third emission layer EML1 or EML3, and so red or purple may be temporarily displayed unintentionally although white should be displayed.

As the organic light-emitting display device has a sub-pixel arrangement structure according to the present embodiment, planar areas of the first to third emission areas EM1, EM2, and EM3, and current amounts supplied to the first to third emission layers EML1, EML2, and EML3 become relatively uniform. Therefore, resolution of the organic light-emitting display device may be increased and a problem that red or purple is temporarily displayed instead of white may be resolved. The organic light-emitting display device according to the present embodiment may display a higher-quality image.

According to the present embodiment, the first emission layer EML1 may emit red light, the second emission layer EML2 may emit green light, and the third emission layer EML3 may emit blue light. However, the present disclosure is not limited thereto, and the first emission layer EML1 may emit green, blue, or white light, the second emission layer EML2 may emit red, blue, or white light, and the third emission layer EML3 may emit red, green, or white light, and colors of light emitted by the first to third emission layers EML1, EML2, and EML3 may be different from one another.

The first to third emission areas EM1, EM2, and EM3 may respectively correspond to the first to third openings OP1, OP2, and OP3 of the pixel-defining layer PDL. A plurality of first openings OP1 and a plurality of second openings OP2 are arranged in turns, or alternately, at centers of the virtual quadrangles VR. A plurality of third openings OP3 are respectively arranged at vertexes of the virtual quadrangles VR adjacent to each other in a row direction and a column direction. A difference between planar areas of the first to third openings OP1, OP2, and OP3 is less than 25% of a largest planar area of the first to third openings OP1, OP2, and OP3.

The number of the first openings OP1 and the number of the second openings OP2 may be substantially the same, and the number of the third openings OP3 may be twice the number of the first openings OP1, or twice the number of the second openings OP2. However, the number of the first openings OP1 and the number of the second openings OP2 may not be exactly the same. Also, the number of the third openings OP3 may not be exactly twice the number of the first openings OP1 or the number of the second openings OP2.

The first openings OP1 may be respectively arranged at centers of the first virtual quadrangles VR1. A center of the first opening OP1 may substantially coincide with a center of the first virtual quadrangle VR1. A planar shape of the first opening OP1 may be a substantially rounded rectangular rhombus as illustrated in FIG. 1.

The second openings OP2 may be respectively arranged at centers of the second virtual quadrangles VR2. A center of the second opening OP2 may substantially coincide with a center of the second virtual quadrangle VR2. A planar shape of the second opening OP2 may be a substantially rounded rectangular rhombus as illustrated in FIG. 1.

Although FIG. 1 illustrates that a planar area of the first opening OP1 and a planar area of the second opening OP2 are substantially the same, the present disclosure is not limited thereto. According to an embodiment, a difference between a planar area of the first opening OP1 and a planar area of the second opening OP2 may be 10% or less, 5% or less, or 3% or less. A planar area of the first opening OP1 may be less than a planar area of the second opening OP2. A difference between a distance L1 between two sides of the first opening OP1 facing each other, and a distance L2 between two sides of the second opening OP2 facing each other may be about 5% or less, about 2.5% or less, or about 1.5% or less.

The third openings OP3 may be respectively arranged at vertexes of the first and second virtual quadrangles VR1 and VR2 aligned adjacent to each other. Centers of the third openings OP3 may substantially respectively coincide with vertexes of the virtual quadrangles VR.

According to an embodiment, a planar shape of the third opening OP3 may be a substantially rounded regular octagon as illustrated in FIG. 1. In this case, depending on a difference between the distance L1 and the distance L2, a difference between a distance La between the first opening OP1 and the third opening OP3 adjacent to each other, and a distance Lb between the second opening OP2 and the third opening OP3 adjacent to each other may be less than about 5%, less than about 2%, or less than about 1%. The distance La may be defined as a shortest distance between an edge of the first opening OP1 and an edge of the third opening OP3, and the distance Lb may be defined as a shortest distance between an edge of the second opening OP2 and an edge of the third opening OP3.

According to an embodiment, the distance La and the distance Lb may be substantially the same. In an embodiment, depending on a difference between the distance L1 and the distance L2, a planar shape of the third opening OP3 may be a substantially rounded octagon, for example, an octagon, or a chamfered octagon. A planar shape of the third opening OP3 may be a shape in which a substantially rounded regular octagon is crushed or shortened in the first direction or the second direction.

Depending on a difference between the distance L1 and the distance L2, a difference between a length L3a of the third opening OP3 in a first direction and a length L3b of the third opening OP3 in a second direction may be about 5% or less, about 3% or less, or about 2% or less. The first direction may be defined as a direction extending from a center of the first opening OP1 to a center of the third opening OP3. The second direction may be defined as a direction extending from a center of the second opening OP2 to a center of the third opening OP3. Depending on relative respective positions of the third openings OP3 with respect to the first and second openings OP1 and OP2, the first direction and the second direction of the third opening OP3 may change.

According to various embodiments, since a difference between the distance L1 and the distance L2 is not large, a difference between a ratio (L3a/La) of the length L3a to the distance La, and a ratio (L3b/Lb) of the length L3b to the distance Lb may be about 5% or less, about 3% or less, or about 2% or less.

A planar area of the third opening OP3 may be less than a planar area of the first opening OP1 and a planar area of the second opening OP2. A planar area of the third opening OP3 may be 75% or more, or 80% or more, of a larger planar area among a planar area of the first opening OP1 and a planar area of the second opening OP2. A planar area of the first opening OP1 may be 90% or more, or 95% or more, of a planar area of the second opening OP2.

Although not shown in FIG. 1, a spacer for preventing or substantially preventing damage of a surface of a structure generated by a mask used for a deposition process of an organic emission material may be arranged on the pixel-defining layer PDL. The spacer may be arranged between the first to third emission layers EML1, EML2, and EML3, and may have a certain height or thickness (e.g., a preset height or thickness), and a planar shape thereof may be substantially a rectangle or square.

Herein, a sub-pixel arrangement structure of an organic light-emitting display device according to another embodiment is described with reference to FIG. 5.

FIG. 5 is a plan view of a portion of a plane of an organic light-emitting display device according to another embodiment. The organic light-emitting display device of FIG. 5 is substantially the same as the organic light-emitting display device of FIG. 1 except for a third emission area EM3' and a third emission layer EML3'. Descriptions of same components are not repeated.

FIG. 5 illustrates first to third emission layers EML1, EML2, and EML3' respectively including first to third emission areas EM1, EM2, and EM3', and a pixel-defining layer PDL including first to third openings OP1, OP2, and OP3' respectively corresponding to the first to third emission areas EM1, EM2, and EM3'. Referring to FIG. 5, the first to third emission areas EM1, EM2, and EM3' respectively substantially coincide with the first to third emission layers EML1, EML2, and EML3'. However, this is exemplary, and similarly as illustrated in FIG. 3, the first to third emission areas EM1, EM2, and EM3' may respectively correspond to portions of the first to third emission layers EML1, EML2, and EML3'.

Referring to FIG. 5, virtual quadrangles VR aligned adjacent to each other in a row direction and a column direction are illustrated. The virtual quadrangles VR may be squares, rectangles substantially close to squares, or parallelograms substantially close to squares.

A plurality of first emission areas EM1 and a plurality of second emission areas EM2 are arranged in turns, or alternately, at centers of the virtual quadrangles VR. A plurality of third emission areas EM3' are respectively arranged at vertexes of the virtual quadrangles VR adjacent to each other in a row direction and a column direction. A difference between planar areas of the first to third emission areas EM1, EM2, and EM3' is less than 25% of a largest planar area among the first to third emission areas EM1, EM2, and EM3'.

A plurality of first openings OP1 and a plurality of second openings OP2 are arranged in turns, or alternately, at centers of the virtual quadrangles VR. A plurality of third openings OP3' are respectively arranged at vertexes of the virtual quadrangles VR adjacent to each other in a row direction and a column direction. Differences between planar areas of the first to third openings OP1, OP2, and OP3' are less than 25% of a largest planar area among the first to third openings OP1, OP2, and OP3'.

In an embodiment, the number of first sub-pixels including the first emission layer EML1 and the number of second sub-pixels including the second emission layer EML2 are the same, and the number of third sub-pixels including the third emission layer EML3' may be twice the number of the first sub-pixels or twice the number of the second sub-pixels. However, the number of the first sub-pixels may be different from the number of the second sub-pixels, and the number of the third sub-pixels may not be exactly twice the number of the first sub-pixels or the number of the second sub-pixels. According to the present embodiment, a number of pixels per inch of the organic light-emitting display device may be 520 or more. For example, the third sub-pixels including 520 or more third emission areas EM3' or third emission layers EML3' within 1 inch may be arranged in a diagonal direction of the virtual quadrangle VR.

The virtual quadrangles VR include first virtual quadrangles VR1 and second virtual quadrangles VR2 aligned in turns, or alternately, adjacent in a row direction and a column direction. All of the first virtual quadrangles VR1 and the second virtual quadrangles VR2 may have the same shape.

The first emission areas EM1 or the first openings OP1 may be arranged at centers of the first virtual quadrangles VR1. A center of the first emission area EM1 or the first opening OP1 may substantially coincide with a center of the first virtual quadrangle VR1. A planar shape of the first emission area EM1 or the first opening OP1 may be a substantially rounded rectangular rhombus as illustrated in FIG. 5.

The second emission areas EM2 or the second openings OP2 may be arranged at centers of the second virtual quadrangles VR2. A center of the second emission area EM2 or the second opening OP2 may substantially coincide with a center of the second virtual quadrangle VR2. A planar shape of the second emission area EM2 or the second opening OP2 may be a substantially rounded rectangular rhombus as illustrated in FIG. 5.

Although FIG. 5 illustrates that the first and second emission areas EM1 and EM2 or the first and second openings OP1 and OP2 have a substantially same planar area, the present disclosure is not limited thereto. A difference between a planar area of the first emission area EM1 or the first opening OP1, and a planar area of the second emission area EM2 or the second opening OP2 may be 10% or less, 5% or less, or 3% or less. The planar area of the first emission area EM1 or the first opening OP1 may be less than the planar area of the second emission area EM2 or the second opening OP2. A difference between a distance L1 between two sides of the first emission area EM1 or the first opening OP1 facing each other, and a distance L2 between two sides of the second emission area EM2 or the second opening OP2 facing each other may be about 5% or less, about 2.5% or less, or about 1.5% or less. The distance L1 may be shorter than the distance L2.

The third emission areas EM3' or the third openings OP3' may be respectively arranged at vertexes of the virtual quadrangles VR. Centers of the third emission areas EM3' or the third openings OP3' may respectively substantially coincide with vertexes of the virtual quadrangles VR. According to an embodiment, a planar shape of the third emission areas EM3' or the third openings OP3' may be a substantially rounded rectangular rhombus as illustrated in FIG. 5.

Planar areas of the third emission areas EM3' or the third openings OP3' may be substantially the same as planar areas of the third emission areas EM3 or the third openings OP3 illustrated in FIG. 1. However, since a planar shape of the third emission areas EM3' or the third openings OP3' is a substantially rounded rectangular rhombus, a length L3a' of the third emission areas EM3' or the third openings OP3' in a first direction, and a length L3b' of the third emission areas EM3' or the third openings OP3' in a second direction may be reduced by about 7% to about 9% compared with a length L3a of the third emission areas EM3 or the third openings OP3 in the first direction, and a length L3b of the third emission areas EM3 or the third openings OP3 in the second direction illustrated in FIG. 1. For example, the length L3a' and the length L3b' of FIG. 5 may be reduced by about 8% compared with the length L3a and the length L3b of FIG. 1.

Accordingly, a distance La' between the first emission area EM1 and the third emission area EM3' adjacent to each other, and a distance Lb' between the second emission area EM2 and the third emission area EM3' may be reduced by about 5% to about 7% compared with the distance La and the distance Lb of FIG. 1. For example, the distance La' and the distance Lb' of FIG. 5 may be respectively reduced by about 6% compared with the distance La and the distance Lb of FIG. 1. Therefore, when it is designed that the distance La' and the distance Lb' are the same as a critical dimension of a process of forming the first to third emission layers EML1, EML2, and EML3' respectively including the first to third emission areas EM1, EM2, and EM3', the organic light-emitting display device according to the embodiment of FIG. 5 may have higher resolution or higher pixels per inch than the embodiment of FIG. 1.

In the case in which a planar shape of the third emission area EM3' or the third opening OP3' is a substantially rounded rectangular rhombus, depending on a difference between the distance L1 and the distance L2, a difference between the distance La' and the distance Lb' may be less than about 5%, less than about 2%, or less than about 1%. The distance La' may be defined as a shortest distance between an edge of the first emission area EM1 and an edge of the third emission area EM3', and the distance Lb' may be defined as a shortest distance between an edge of the second emission area EM2 and an edge of the third emission area EM3'. For example, both the distance La' and the distance Lb' may be greater than 10 μm and less than 20 μm. For example, both the distance La' and the distance Lb' may be about 18 μm or 19 μm. For example, the distance La' and the distance Lb' may be respectively about 18.78 μm and about 18.6 μm, and the distance La' may be longer than the distance Lb' by about 1%.

According to an embodiment, the distance La' and the distance Lb' may be substantially the same. For example, both the distance La' and the distance Lb' may be greater than 10 μm and less than 20 μm. For example, both the distance La' and the distance Lb' may be about 18.6 μm. The distance La' and the distance Lb' may be a critical dimension of a process of forming the first to third emission layers EML1, EML2, and EML3' and thus may be the same. In an embodiment, a planar shape of the third emission area EM3' may be a shape in which a substantially rounded rectangular rhombus is crushed or shortened in the first direction or the second direction. For example, the planar shape of the third emission area EM3' may be a shape in which a substantially rounded rectangle is rotated by about 45°.

Depending on a difference between the distance L1 and the distance L2, a difference between the length L3a' of the third emission area EM3' in the first direction, and the length L3b' of the third emission area EM3' in the second direction may be less than about 5%, less than about 3%, or less than about 2%.

According to an embodiment, as a planar shape of the third emission areas EM3' is a substantially rounded rectangular rhombus, a distance Lc' between the third emission areas EM3' adjacent to each other is reduced compared to the distance Lc of FIG. 1. Therefore, the distance Lc' may be shorter than a critical dimension of a process of forming the third emission layers EML3' including the third emission areas EM3' by using one mask, for example, a fine metal mask. For example, the distance Lc' may be about 29.44 μm.

In this case, the third emission layers EML3' may be formed through two processes of using two masks. A method of manufacturing an organic light-emitting display device including the third emission layers EML3' is described below in more detail with reference to FIGS. 6A to 6D.

A planar area of the third emission area EM3' may be less than a planar area of the first emission area EM1 and a planar area of the second emission area EM2. According to an embodiment, the planar area of the third emission area EM3' may be 75% or more, or 80% or more, of a larger planar area among the planar area of the first emission area EM1 and the planar area of the second emission area EM2. As the organic light-emitting display device has a sub-pixel arrangement structure according to the present embodiment, when the organic light-emitting display device displays full white, a current amount supplied to the third emission layers EML3' may be 75% or more, or 80% or more, of a larger current amount among a current amount supplied to the first emission layer EML1 and a current amount supplied to the second emission layer EML2.

As the organic light-emitting display device has a sub-pixel arrangement structure according to the present embodiment, planar areas of the first to third emission layers EML1, EML2, and EML3', and current amounts supplied thereto become relatively uniform. Therefore, resolution of the organic light-emitting display device may be raised, and a problem that red or purple is temporarily displayed instead of white may be resolved. The organic light-emitting display device according to the present embodiment may display an image of a higher quality.

According to the present embodiment, the first emission layer EML1 may emit red light, the second emission layer EML2 may emit green light, and the third emission layer EML3' may emit blue light. However, the present disclosure is not limited thereto.

FIGS. 6A to 6D are plan views of a portion of first to fourth masks for manufacturing an organic light-emitting display device of FIG. 5.

In an embodiment, the first to fourth masks MSK1, MSK2, MSK3, and MSK4 respectively illustrated in FIGS. 6A to 6D may be fine metal masks.

Figure 6A:
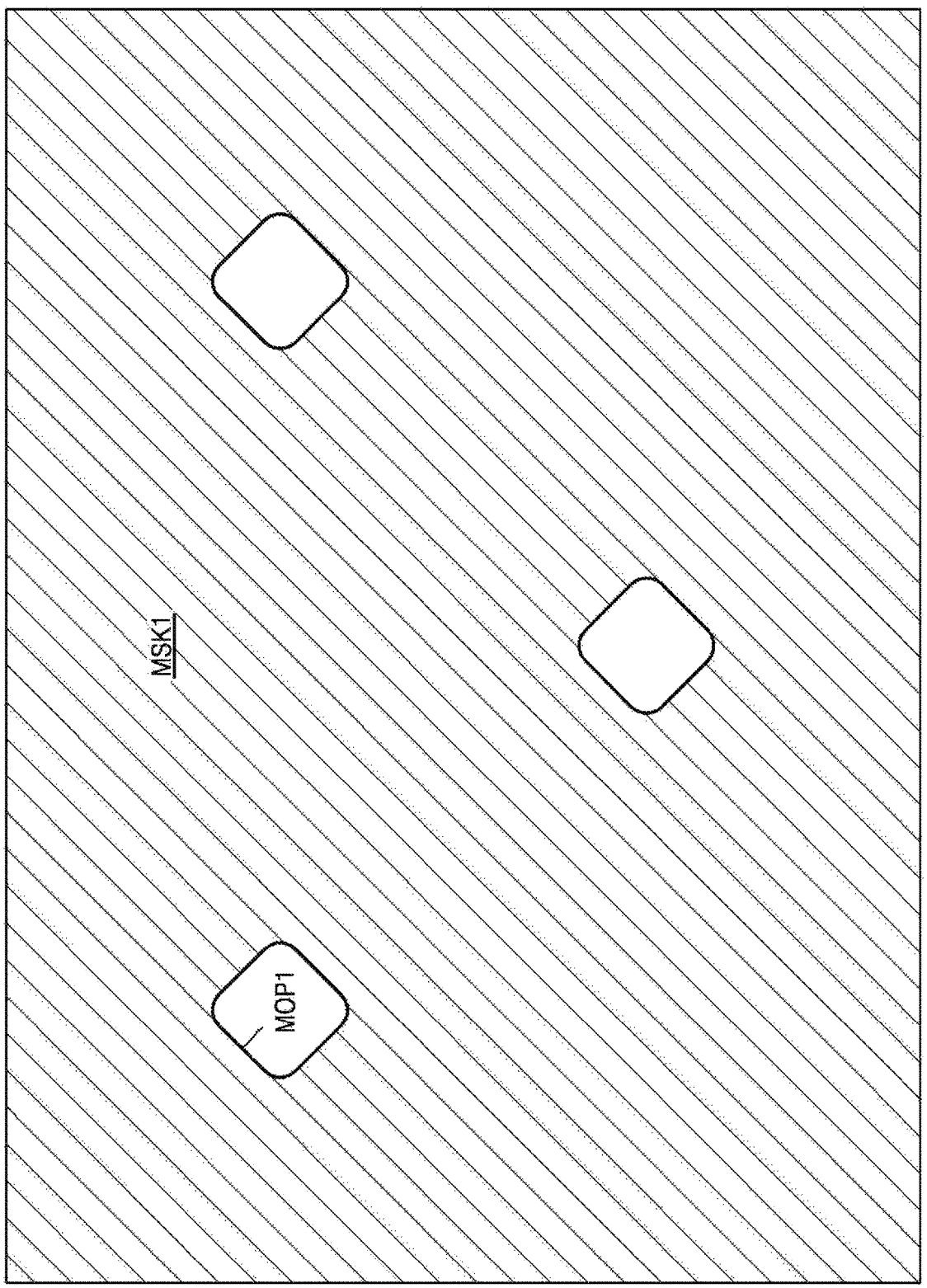

The first mask MSK1 illustrated in FIG. 6A is a mask for forming the first emission layer EML1 of FIG. 5 and has a first mask opening MOP1 corresponding to a location of the first emission area EM1 or the first opening OP1. The first emission layer EML1 may be formed by depositing a first organic emission material which has passed through the first mask opening MOP1.

The second mask MSK2 illustrated in FIG. 6B is a mask for forming the second emission layer EML2 of FIG. 5 and has a second mask opening MOP2 corresponding to a location of the second emission area EM2 or the second opening OP2. The second emission layer EML2 may be formed by depositing a second organic emission material which has passed through the second mask opening MOP2.

The third mask MSK3 illustrated in FIG. 6C is a mask for forming a portion of the third emission layers EML3' of FIG. 5 and has a third mask opening MOP3a corresponding to a location of a portion of the third emission areas EM3' or a portion of the third openings OP3'. A portion of the third emission layers EML3' may be formed by depositing a third organic emission material which has passed through the third mask opening MOP3a.

Figure 6D:
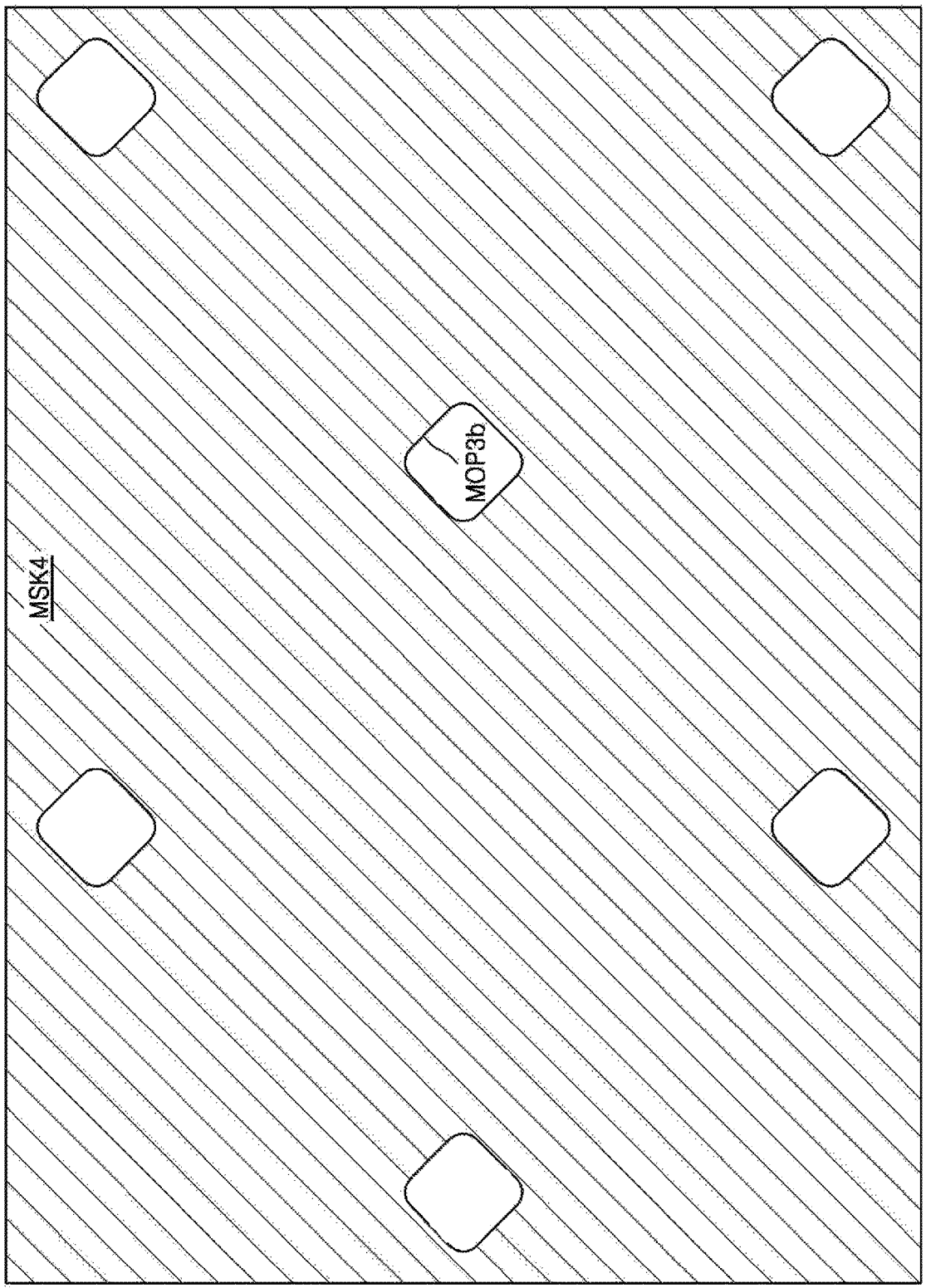

The fourth mask MSK4 illustrated in FIG. 6D is a mask for forming the rest of the third emission layers EML3' of FIG. 5 and has a fourth mask opening MOP3b corresponding to a location of the rest of the third emission layers EML3' or the rest of the third openings OP3'. The rest of the third emission layers EML3' may be formed by depositing a third organic emission material which has passed through the fourth mask opening MOP3b.

Referring to FIGS. 6C and 6D, a portion of the third emission layers EML3' formed by the third mask MSK3 and the rest of the third emission layers EML3' formed by the fourth mask MSK4 are arranged in turns, or alternately, in a row direction and a column direction. Accordingly, an interval between the third mask openings MOP3a and an interval between the fourth mask openings MOP3b are greater than a critical dimension for forming the third emission layer EML3' by using one mask. Therefore, the third emission layers EML3' including the third emission area EM3' having a planar shape of a substantially rounded rectangular rhombus may be formed by performing deposition twice by using the third mask MSK3 and the fourth mask MSK4.

FIG. 7 is a reference view of overlapped first to fourth masks illustrated in FIGS. 6A to 6D.

Referring to FIG. 7, to represent relative locations of the first to fourth mask openings MOP1, MOP2, MOP3a, and MOP3b of the first to fourth masks MSK1, MSK2, MSK3, and MSK4 illustrated in FIGS. 6A to 6D, the first to fourth mask openings MOP1, MOP2, MOP3a, and MOP3b are represented in an overlapping manner.

The first mask openings MOP1 illustrated in FIG. 7 are arranged at locations respectively corresponding to the first emission layers EML1 illustrated in FIG. 5. The second mask openings MOP2 illustrated in FIG. 7 are arranged at locations respectively corresponding to the second emission layers EML2 illustrated in FIG. 5. The third and fourth mask openings MOP3a and MOP3b illustrated in FIG. 7 are arranged at locations respectively corresponding to the third emission layers EML3' illustrated in FIG. 5.

According to an embodiment, to increase deposition reliability, the first to fourth mask openings MOP1, MOP2, MOP3a, and MOP3b may respectively have larger planar areas than those of the first to third emission areas EM1, EM2, and EM3' or the first to third openings OP1, OP2, and OP3', and may respectively have planar shapes different from those of the first to third emission areas EM1, EM2, and EM3' or the first to third openings OP1, OP2, and OP3'.

According to another embodiment, the first to fourth mask openings MOP1, MOP2, MOP3a, and MOP3b may respectively have substantially the same planar shapes and areas as those of the first to third emission areas EM1, EM2, and EM3' or the first to third openings OP1, OP2, and OP3'.

Figure 8:
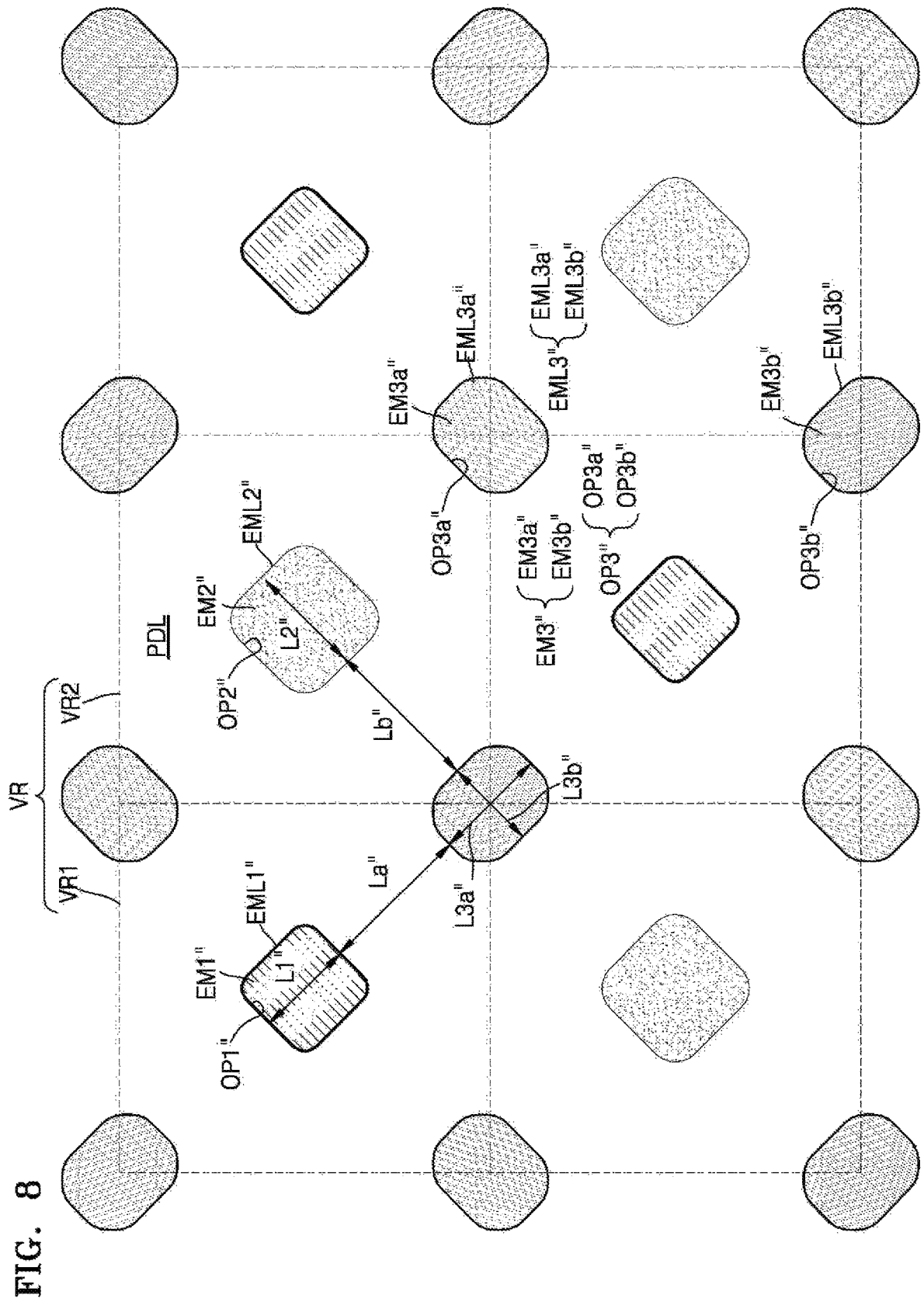
FIG. 8 is a plan view of a portion of a plane of an organic light-emitting display device according to another embodiment.

FIG. 8 is a plan view of a portion of a plane of an organic light-emitting display device according to another embodiment.

The organic light-emitting display device of FIG. 8 is substantially the same as the organic light-emitting display device of FIG. 1 except for planar shapes of first to third emission areas EM1", EM2", and EM3". Descriptions of same components are not repeated.

FIG. 8 illustrates a pixel-defining layer PDL including first to third emission areas EM1", EM2", and EM3", and first to third openings OP1", OP2", and OP3" corresponding to the first to third emission areas EM1", EM2", and EM3". FIG. 8 illustrates that the first to third emission areas EM1", EM2", and EM3" respectively substantially coincide with first to third emission layers EML1", EML2", and EML3". However, this is exemplary, and similarly as illustrated in FIG. 3, the first to third emission areas EM1", EM2", and EM3" may respectively correspond to portions of the first to third emission layers EML1", EML2", and EML3".

Virtual quadrangles VR aligned adjacent in a row direction and a column direction are illustrated. The virtual quadrangles VR may be squares, rectangles substantially close to squares, or parallelograms substantially close to squares.

The plurality of first emission areas EM1" and the plurality of second emission areas EM2" are arranged at centers of the virtual quadrangles VR. The plurality of third emission areas EM3" are respectively arranged at vertexes of the virtual quadrangles VR adjacent to each other in a row direction and a column direction. A difference between planar areas of the first to third emission areas EM1", EM2", and EM3" is less than 25% of a largest planar area among the first to third emission areas EM1", EM2", and EM3".

The plurality of first openings OP1" and the plurality of second openings OP2" are arranged at centers of the virtual quadrangles VR. The plurality of third openings OP3" are arranged at vertexes of the virtual quadrangles VR adjacent to each other in a row direction and a column direction. A difference between planar areas of the first to third openings OP1", OP2", and OP3" is less than 25% of a largest planar area among the first to third openings OP1", OP2", and OP3".

The number of first sub-pixels including the first emission layer EML1" may be the same as the number of second sub-pixels including the second emission layer EML2". The number of third sub-pixels including the third emission layer EML3" may be twice the number of the first sub-pixels or twice the number of the second sub-pixels. However, the number of the first sub-pixels may be different from the number of the second sub-pixels, and the number of the third sub-pixels may not be exactly twice the number of the first sub-pixels or the number of the second sub-pixels.

The virtual quadrangles VR include first virtual quadrangles VR1 and second virtual quadrangles VR2 aligned in turns, or alternately, adjacent to each other in a row direction and a column direction. Both the first virtual quadrangles VR1 and the second virtual quadrangles VR2 may have a same shape.

The first emission areas EM1" or the first openings OP1" may be respectively arranged at centers of the first virtual quadrangles VR1. Centers of the first emission areas EM1" or the first openings OP1" may substantially coincide with centers of the first virtual quadrangles VR1.

The second emission areas EM2" or the second openings OP2" may be respectively arranged at centers of the second virtual quadrangles VR2. Centers of the second emission areas EM2" or the second openings OP2" may substantially coincide with centers of the second virtual quadrangles VR2.

The third emission areas EM3" or the third openings OP3" may be respectively arranged at vertexes of the virtual quadrangles VR. Centers of the third emission areas EM3" or the third openings OP3" may respectively substantially coincide with vertexes of the virtual quadrangles VR.

A planar shape of the first emission areas EM1" or the first openings OP1" may be substantially the same as a planar shape of the second emission areas EM2" or the second openings OP2", and may be different from a planar shape of the third emission areas EM3" or the third openings OP3". For example, a planar shape of the first emission areas EM1" or the first openings OP1", and a planar shape of the second emission areas EM2" or the second openings OP2" may be a substantially rounded rectangular rhombus, and a planar shape of the third emission areas EM3" or the third openings OP3" may be a substantially rounded octagon or a shape in which a substantially rounded octagon is stretched or lengthened in a first direction and is compressed or shortened in a second direction. The first direction may be defined as a direction extending from a center of the first emission areas EM1" to a center of the third emission areas EM3". The second direction may be defined as a direction extending from a center of the second emission areas EM2" to a center of the third emission areas EM3". Depending on relative positions of the third emission areas EM3" with respect to the first and second emission areas EM1" and EM2", the first direction and the second direction of the third emission areas EM3" may change.

The third emission area EM3" or the third opening OP3" may be divided into a third emission area EM3$a$" or a third opening OP3$a$", and a third emission area EM3$b$" or a third opening OP3$b$". The third emission area EM3$a$" or the third opening OP3$a$" has a planar shape stretching in a right up-left down direction, and the third emission area EM3$b$" or the third opening OP3$b$" has a planar shape stretching in a left up-right down direction.

The third emission area EM3$a$" and the third emission area EM3$b$" may be arranged in turns, or alternately, in a row direction and a column direction. The third emission area EM3$a$" and the third emission area EM3$b$" may be vertically symmetric and horizontally symmetric. Accordingly, four third emission areas EM3" or third openings OP3" adjacent and around the center of the virtual quadrangle VR may be vertically symmetric and horizontally symmetric.

As illustrated in FIG. 8, a planar area of the first emission area EM1" or the first opening OP1" may be less than a planar area of the second emission area EM2" or the second opening OP2". The planar area of the first emission area EM1" or the first opening OP1" may be 80% or more, 90% or more, or 95% or more of the planar area of the second emission area EM2" or the second opening OP2". A distance L1" between two sides of the first emission area EM1" or the first opening OP1" facing each other may be about 90% or more, about 95% or more, or about 97.5% or more of a distance L2" between two sides of the second emission area EM2" or the second opening OP2" facing each other.

A distance La" between the first emission area EM1" and the third emission area EM3" adjacent to each other and a distance Lb" between the second emission area EM2" and the third emission area EM3" may be substantially the same. For example, the distance La" and the distance Lb" may be the same as a critical dimension of a process of forming the first to third emission layers EML1", EML2", and EML3" respectively including the first to third emission areas EM1", EM2", and EM3".

In an embodiment, since the distance L1" is shorter than the distance L2", and the distance La" and the distance Lb" are the same, a length L3$a$" of the third emission area EM3" in the first direction may be longer than a length L3$b$" of the third emission area EM3" in the second direction. The length L3$b$" in the second direction may be 90% or more, 95% or more, or 97.5% or more of the length L3$a$" in the first direction. A difference between the length of the third emission area EM3" in the first direction and the length of the third emission area EM3" in the second direction may be less than 10%, less than 5%, or less than 2.5%.

According to various embodiments, a display device having a high-resolution pixel arrangement structure wherein an interval between adjacent emission layers is efficiently set and an aperture ratio of a sub-pixel is secured is provided.

Although the disclosure has been described with reference to some embodiments illustrated in the drawings, this is merely provided as an example, and it is to be understood by those of ordinary skill in the art that various changes in form and details and equivalents thereof may be made therein without departing from the spirit and scope of the disclosure as set forth in the following claims.

What is claimed is:

1. A display device comprising:
    a plurality of first emission areas and a plurality of second emission areas alternately arranged at centers of virtual quadrangles aligned adjacent to each other in a row direction and a column direction; and
    a plurality of third emission areas respectively arranged at vertexes of the virtual quadrangles, wherein
    the smaller of a first distance and a second distance is 95% or more of the larger of the first distance and the second distance, the first distance being a distance between the third emission areas and the first emission areas adjacent to each other, the second distance being a distance between the third emission areas and the second emission areas adjacent to each other.

2. The display device of claim 1, wherein the first emission areas emit red light, the second emission areas emit green light, and the third emission areas emit blue light.

3. The display device of claim 1, wherein a smallest planar area among the first to third emission areas is 75% or more of a largest planar area among the first to third emission areas.

4. The display device of claim 1, wherein a planar area of each of the third emission areas is 75% or more of a larger area from among a planar area of each of the first emission areas and a planar area of each of the second emission areas.

5. The display device of claim 1, wherein a planar area of each of the third emission areas is smaller than the smaller of a planar area of each of the first emission areas and a planar area of each of the second emission areas.

6. The display device of claim 1, further comprising:
    a substrate;
    a pixel electrode layer over the substrate and comprising a plurality of first pixel electrodes, a plurality of second pixel electrodes, and a plurality of third pixel electrodes;
    a pixel-defining layer over the pixel electrode layer and comprising a plurality of first openings each exposing a portion of the first pixel electrode, a plurality of second openings each exposing a portion of the second pixel electrode, and a plurality of third openings each exposing a portion of the third pixel electrode;
    a plurality of first emission layers each being on the first pixel electrode and comprising the first emission areas corresponding to the first openings;
    a plurality of second emission layers each being on the second pixel electrode and comprising the second emission areas corresponding to the second openings;
    a plurality of third emission layers each being on the third pixel electrode and comprising the third emission areas corresponding to the third openings; and
    an opposite electrode covering the first to third emission layers.

7. The display device of claim 6, wherein when the display device displays white at maximum brightness, a current amount supplied to the third emission layers is 75% or more of a larger current amount among a current amount supplied to the first emission layers and a current amount supplied to the second emission layers.

8. The display device of claim 1, wherein a planar shape of each of the first emission areas and a planar shape of each of the second emission areas are substantially rounded rectangular rhombuses.

9. The display device of claim 1, wherein a planar shape of each of the third emission areas is a substantially rounded rectangular rhombus.

10. The display device of claim 1, wherein a planar shape of each of the third emission areas is a substantially rounded regular octagon.

11. The display device of claim 1, wherein a planar shape of each of the third emission areas is a rounded regular octagon, a rounded quadrangle or a rounded rectangle.

12. The display device of claim 11, wherein the first distance is substantially the same as the second distance.

13. The display device of claim 11, wherein a length of each of the third emission areas in a first direction is different from a length of each of the third emission areas in a second direction by less than 5%, the first direction being a direction extending from a center of one of the first emission areas to a center of one of the third emission areas, the second direction being a direction extending from a center of one of the second emission areas to a center of one of the third emission areas.

14. The display device of claim 1, wherein a ratio of a length of each of the third emission areas in a first direction to the first distance is different from a ratio of a length of each of the third emission areas in a second direction to the second distance by less than 5%, the first direction being a direction extending from a center of one of the first emission areas to a center of one of the third emission areas, the second direction being a direction extending from a center of one of the second emission areas to a center of one of the third emission areas.

15. The display device of claim 1, wherein a planar shape of each of the first emission areas is substantially the same as a planar shape of each of the second emission areas, and a planar shape of each of the third emission areas is different from the planar shapes of the first emission areas and the second emission areas.

16. The display device of claim 15, wherein a length of each of the third emission areas in a first direction is different from a length of each of the third emission areas in a second direction by less than 10%, the first direction being a direction extending from a center of one of the first emission areas to a center of one of the third emission areas, the second direction being a direction extending from a center of one of the second emission areas to a center of one of the third emission areas.

17. The display device of claim 15, wherein, from among the plurality of third emission areas, four third emission areas are arranged adjacent to and vertically and horizontally symmetric with respect to a center of each of the virtual quadrangles.

18. The display device of claim 1, wherein five hundred or more third emission areas are arranged within one inch in a diagonal direction of the virtual quadrangle.

19. The display device of claim 1, wherein each of the virtual quadrangles is substantially a rectangle or a square.

20. A display device comprising:
a substrate comprising first virtual quadrangles and second virtual quadrangles alternately arranged adjacent to each other in a row direction and a column direction and having a same shape;
a pixel electrode layer over the substrate and comprising a plurality of first pixel electrodes, a plurality of second pixel electrodes, and a plurality of third pixel electrodes;
a pixel-defining layer over the pixel electrode layer and comprising a plurality of first openings each exposing a portion of one of the first pixel electrodes and arranged at a center of each of the first virtual quadrangles, a plurality of second openings each exposing a portion of one of the second pixel electrodes and arranged at a center of each of the second virtual quadrangles, and a plurality of third openings each exposing a portion of one of the third pixel electrodes and respectively arranged at vertexes of the first and second virtual quadrangles;
a plurality of first emission layers each being arranged on one of the first pixel electrodes such that at least a portion of each of the first emission layers fills one of the first openings;
a plurality of second emission layers each being arranged on one of the second pixel electrodes such that at least a portion of each of the second emission layers fills one of the second openings;
a plurality of third emission layers each being arranged on one of the third pixel electrodes such that at least a portion of each of the third emission layers fills one of the third openings; and
an opposite electrode covering the plurality of first to third emission layers, wherein
the smaller of a first distance and a second distance is 95% or more of the larger of the first distance and the second distance, the first distance being a distance between the third emission areas and the first emission areas adjacent to each other, the second distance being a distance between the third emission areas and the second emission areas adjacent to each other.

* * * * *